United States Patent
Mandal et al.

(10) Patent No.: US 11,739,429 B2
(45) Date of Patent: Aug. 29, 2023

(54) METHODS FOR REFURBISHING AEROSPACE COMPONENTS

(71) Applicant: Applied Materials, Inc., Santa Clara, CA (US)

(72) Inventors: Abhishek Mandal, Maharashtra (IN); Nitin Deepak, Mumbai (IN); Neha Gupta, Bangalore (IN); Prerna Sonthalia Goradia, Mumbai (IN); Ankur Kadam, Mumbai (IN); Kenichi Ohno, Sunnyvale, CA (US); David Alexander Britz, Los Gatos, CA (US); Lance A. Scudder, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/339,411

(22) Filed: Jun. 4, 2021

(65) Prior Publication Data
US 2022/0002883 A1 Jan. 6, 2022

(30) Foreign Application Priority Data
Jul. 3, 2020 (IN) .............................. 202041028360

(51) Int. Cl.
*C23C 16/40* (2006.01)
*C23G 1/10* (2006.01)
(Continued)

(52) U.S. Cl.
CPC .................. *C23G 1/10* (2013.01); *B64F 5/40* (2017.01); *C11D 7/06* (2013.01); *C11D 7/08* (2013.01);
(Continued)

(58) Field of Classification Search
CPC ...... C23C 16/0227; C23C 16/34; C23C 16/40
See application file for complete search history.

(56) References Cited

U.S. PATENT DOCUMENTS

| 4,698,130 A | 10/1987 | Restall et al. |
|---|---|---|
| 5,217,757 A | 6/1993 | Olson et al. |

(Continued)

FOREIGN PATENT DOCUMENTS

| CN | 104647828 A | 5/2015 |
|---|---|---|
| EP | 0209307 A1 | 1/1987 |

(Continued)

OTHER PUBLICATIONS

Liu, Ron, "An Overview of Aluminum Protective Coating Properties and Treatments". OPTI 521, 2009, pp. 1-38.*

(Continued)

*Primary Examiner* — Bret P Chen
(74) *Attorney, Agent, or Firm* — Patterson + Sheridan, LLP

(57) ABSTRACT

Methods for refurbishing aerospace components by removing corrosion and depositing protective coatings are provided herein. In one or more embodiments, a method of refurbishing an aerospace component includes exposing the aerospace component containing corrosion to an aqueous cleaning solution. The aerospace component contains a nickel superalloy, an aluminide layer disposed on the nickel superalloy, and an aluminum oxide layer disposed on the aluminide layer. The method includes removing the corrosion from a portion of the aluminum oxide layer with the aqueous cleaning solution to reveal the aluminum oxide layer, then exposing the aluminum oxide layer to a post-rinse, and forming a protective coating on the aluminum oxide layer.

20 Claims, 10 Drawing Sheets

(51) Int. Cl.
    *C23C 16/02* (2006.01)
    *C23C 16/34* (2006.01)
    *B64F 5/40* (2017.01)
    *C11D 7/32* (2006.01)
    *C11D 7/06* (2006.01)
    *C11D 7/08* (2006.01)
    *C11D 11/00* (2006.01)

(52) U.S. Cl.
    CPC ........ *C11D 7/3245* (2013.01); *C11D 11/0023* (2013.01); *C23C 16/0227* (2013.01); *C23C 16/34* (2013.01); *C23C 16/40* (2013.01)

(56) References Cited

U.S. PATENT DOCUMENTS

| | | | |
|---|---|---|---|
| 5,362,228 A | 11/1994 | Vaudel | |
| 5,407,705 A * | 4/1995 | Vakil | C23C 16/12 427/255.39 |
| 5,503,874 A | 4/1996 | Ackerman et al. | |
| 5,584,663 A * | 12/1996 | Schell | C23C 24/103 148/428 |
| 5,950,925 A | 9/1999 | Fukunaga et al. | |
| 6,042,898 A | 3/2000 | Burns et al. | |
| 6,156,382 A | 12/2000 | Rajagopalan et al. | |
| 6,162,715 A | 12/2000 | Mak et al. | |
| 6,207,295 B1 | 3/2001 | Stowell et al. | |
| 6,245,192 B1 | 6/2001 | Dhindsa et al. | |
| 6,309,713 B1 | 10/2001 | Mak et al. | |
| 6,332,926 B1 | 12/2001 | Pfaendtner et al. | |
| 6,359,089 B2 | 3/2002 | Hung et al. | |
| 6,379,466 B1 | 4/2002 | Sahin et al. | |
| 6,402,898 B1 | 6/2002 | Brumer et al. | |
| 6,437,066 B1 | 8/2002 | Hung et al. | |
| 6,465,040 B2 | 10/2002 | Gupta et al. | |
| 6,495,271 B1 | 12/2002 | Vakil | |
| 6,551,929 B1 | 4/2003 | Kori et al. | |
| 6,607,976 B2 | 8/2003 | Chen et al. | |
| 6,620,670 B2 | 9/2003 | Song et al. | |
| 6,620,723 B1 | 9/2003 | Byun et al. | |
| 6,620,956 B2 | 9/2003 | Chen et al. | |
| 6,630,244 B1 | 10/2003 | Mao et al. | |
| 6,677,247 B2 | 1/2004 | Yuan et al. | |
| 6,740,585 B2 | 5/2004 | Yoon et al. | |
| 6,784,096 B2 | 8/2004 | Chen et al. | |
| 6,797,340 B2 | 9/2004 | Fang et al. | |
| 6,800,376 B1 | 10/2004 | Gupta et al. | |
| 6,805,750 B1 | 10/2004 | Ristau et al. | |
| 6,809,026 B2 | 10/2004 | Yoon et al. | |
| 6,811,814 B2 | 11/2004 | Chen et al. | |
| 6,821,891 B2 | 11/2004 | Chen et al. | |
| 6,825,134 B2 | 11/2004 | Law et al. | |
| 6,827,978 B2 | 12/2004 | Yoon et al. | |
| 6,831,021 B2 | 12/2004 | Chua et al. | |
| 6,833,161 B2 | 12/2004 | Wang et al. | |
| 6,838,125 B2 | 1/2005 | Chung et al. | |
| 6,846,516 B2 | 1/2005 | Yang et al. | |
| 6,869,838 B2 | 3/2005 | Law et al. | |
| 6,872,429 B1 | 3/2005 | Chen et al. | |
| 6,905,939 B2 | 6/2005 | Yuan et al. | |
| 6,911,391 B2 | 6/2005 | Yang et al. | |
| 6,924,191 B2 | 8/2005 | Liu et al. | |
| 6,936,538 B2 | 8/2005 | Byun | |
| 6,939,801 B2 | 9/2005 | Chung et al. | |
| 6,939,804 B2 | 9/2005 | Lai et al. | |
| 6,949,342 B2 | 9/2005 | Golub et al. | |
| 6,951,804 B2 | 10/2005 | Seutter et al. | |
| 6,972,267 B2 | 12/2005 | Cao et al. | |
| 7,011,947 B2 | 3/2006 | Golub et al. | |
| 7,026,238 B2 | 4/2006 | Xi et al. | |
| 7,041,335 B2 | 5/2006 | Chung | |
| 7,049,226 B2 | 5/2006 | Chung et al. | |
| 7,081,271 B2 | 7/2006 | Chung et al. | |
| 7,101,795 B1 | 9/2006 | Xi et al. | |
| 7,211,144 B2 | 5/2007 | Lu et al. | |
| 7,211,508 B2 | 5/2007 | Chung et al. | |
| 7,241,686 B2 | 7/2007 | Marcadal et al. | |
| 7,244,683 B2 | 7/2007 | Chung et al. | |
| 7,262,133 B2 | 8/2007 | Chen et al. | |
| 7,264,846 B2 | 9/2007 | Chang et al. | |
| 7,265,048 B2 | 9/2007 | Chung et al. | |
| 7,279,432 B2 | 10/2007 | Xi et al. | |
| 7,285,312 B2 | 10/2007 | Li | |
| 7,317,229 B2 | 1/2008 | Hung et al. | |
| 7,371,467 B2 | 5/2008 | Han et al. | |
| 7,396,565 B2 | 7/2008 | Yang et al. | |
| 7,404,985 B2 | 7/2008 | Chang et al. | |
| 7,405,158 B2 | 7/2008 | Lai et al. | |
| 7,416,979 B2 | 8/2008 | Yoon et al. | |
| 7,429,402 B2 | 9/2008 | Gandikota et al. | |
| 7,429,540 B2 | 9/2008 | Olsen | |
| 7,439,191 B2 | 10/2008 | Law et al. | |
| 7,473,655 B2 | 1/2009 | Wang et al. | |
| 7,501,248 B2 | 3/2009 | Golub et al. | |
| 7,507,660 B2 | 3/2009 | Chen et al. | |
| 7,531,468 B2 | 5/2009 | Metzner et al. | |
| 7,547,952 B2 | 6/2009 | Metzner et al. | |
| 7,569,501 B2 | 8/2009 | Metzner et al. | |
| 7,573,586 B1 | 8/2009 | Boyer et al. | |
| 7,585,762 B2 | 9/2009 | Shah et al. | |
| 7,595,263 B2 | 9/2009 | Chung et al. | |
| 7,601,652 B2 | 10/2009 | Singh et al. | |
| 7,651,955 B2 | 1/2010 | Ranish et al. | |
| 7,732,327 B2 | 6/2010 | Lee et al. | |
| 7,737,028 B2 | 6/2010 | Wang et al. | |
| 7,776,395 B2 | 8/2010 | Mahajani | |
| 7,816,200 B2 | 10/2010 | Kher | |
| 7,824,743 B2 | 11/2010 | Lee et al. | |
| 7,833,358 B2 | 11/2010 | Chu et al. | |
| 7,846,840 B2 | 12/2010 | Kori et al. | |
| 7,867,900 B2 | 1/2011 | Lee et al. | |
| 7,875,119 B2 | 1/2011 | Gartland et al. | |
| 7,910,165 B2 | 3/2011 | Ganguli et al. | |
| 7,910,231 B2 | 3/2011 | Schuh et al. | |
| 7,910,446 B2 | 3/2011 | Ma et al. | |
| 7,964,505 B2 | 6/2011 | Khandelwal et al. | |
| 7,972,978 B2 | 7/2011 | Mahajani | |
| 8,043,907 B2 | 10/2011 | Ma et al. | |
| 8,056,652 B2 | 11/2011 | Lockwood et al. | |
| 8,227,078 B2 | 7/2012 | Morra et al. | |
| 8,277,670 B2 | 10/2012 | Heo et al. | |
| 8,470,460 B2 | 6/2013 | Lee | |
| 8,721,812 B2 | 5/2014 | Furrer et al. | |
| 8,741,420 B2 | 6/2014 | Bunker et al. | |
| 8,858,873 B2 * | 10/2014 | Mittendorf | F01D 5/28 420/441 |
| 8,871,297 B2 | 10/2014 | Barnett et al. | |
| 9,255,327 B2 | 2/2016 | Winter et al. | |
| 9,347,145 B2 | 5/2016 | Bessho | |
| 9,683,281 B2 | 6/2017 | Meehan et al. | |
| 9,777,583 B2 | 10/2017 | Leggett | |
| 9,873,940 B2 | 1/2018 | Xu et al. | |
| 10,072,335 B2 | 9/2018 | Marquardt et al. | |
| 10,287,899 B2 | 5/2019 | Dierberger | |
| 10,369,593 B2 | 8/2019 | Barnett et al. | |
| 10,443,142 B2 | 10/2019 | Miettinen et al. | |
| 10,488,332 B2 | 11/2019 | Kessler et al. | |
| 10,633,740 B2 | 4/2020 | Melnik et al. | |
| 11,028,480 B2 | 6/2021 | Knisley et al. | |
| 2002/0002258 A1 | 1/2002 | Hung et al. | |
| 2002/0009611 A1 * | 1/2002 | Darolia | B32B 15/018 416/241 R |
| 2002/0045782 A1 | 4/2002 | Hung et al. | |
| 2002/0117399 A1 | 8/2002 | Chen et al. | |
| 2002/0127336 A1 | 9/2002 | Chen et al. | |
| 2002/0136824 A1 | 9/2002 | Gupta et al. | |
| 2003/0010451 A1 | 1/2003 | Tzu et al. | |
| 2003/0057526 A1 | 3/2003 | Chung et al. | |
| 2003/0059535 A1 | 3/2003 | Luo et al. | |
| 2003/0059538 A1 | 3/2003 | Chung et al. | |
| 2003/0072884 A1 | 4/2003 | Zhang et al. | |
| 2003/0082301 A1 | 5/2003 | Chen et al. | |
| 2003/0083213 A1 * | 5/2003 | Kool | C23C 10/02 134/28 |

(56) References Cited

U.S. PATENT DOCUMENTS

| | | |
|---|---|---|
| 2003/0123216 A1 | 7/2003 | Yoon et al. |
| 2003/0124262 A1 | 7/2003 | Chen et al. |
| 2003/0132319 A1 | 7/2003 | Hytros et al. |
| 2003/0134300 A1 | 7/2003 | Golub et al. |
| 2003/0136520 A1 | 7/2003 | Yudovsky et al. |
| 2003/0139005 A1 | 7/2003 | Song et al. |
| 2003/0145875 A1 | 8/2003 | Han et al. |
| 2003/0152980 A1 | 8/2003 | Golub et al. |
| 2003/0157760 A1 | 8/2003 | Xi et al. |
| 2003/0172872 A1 | 9/2003 | Thakur et al. |
| 2003/0198754 A1 | 10/2003 | Xi et al. |
| 2003/0203616 A1 | 10/2003 | Chung et al. |
| 2003/0215570 A1 | 11/2003 | Seutter et al. |
| 2003/0235961 A1 | 12/2003 | Metzner et al. |
| 2004/0009665 A1 | 1/2004 | Chen et al. |
| 2004/0013803 A1 | 1/2004 | Chung et al. |
| 2004/0018738 A1 | 1/2004 | Liu |
| 2004/0079648 A1 | 4/2004 | Khan et al. |
| 2004/0161628 A1 | 8/2004 | Gupta et al. |
| 2004/0171280 A1 | 9/2004 | Conley et al. |
| 2005/0003310 A1 | 1/2005 | Bai et al. |
| 2005/0008780 A1 | 1/2005 | Ackerman et al. |
| 2005/0019593 A1 | 1/2005 | Mancini et al. |
| 2005/0020463 A1* | 1/2005 | Ikemoto .............. C11D 11/0047 510/175 |
| 2005/0035086 A1* | 2/2005 | Chen .................... C23G 1/02 216/83 |
| 2005/0053467 A1 | 3/2005 | Ackerman et al. |
| 2005/0085031 A1 | 4/2005 | Lopatin et al. |
| 2005/0126593 A1* | 6/2005 | Budinger .............. B08B 7/0071 134/21 |
| 2005/0158590 A1 | 7/2005 | Li |
| 2005/0255329 A1 | 11/2005 | Hazel |
| 2005/0260347 A1 | 11/2005 | Narwankar et al. |
| 2005/0260357 A1 | 11/2005 | Olsen et al. |
| 2005/0271813 A1 | 12/2005 | Kher et al. |
| 2006/0008838 A1 | 1/2006 | Golub et al. |
| 2006/0019032 A1 | 1/2006 | Wang et al. |
| 2006/0019033 A1 | 1/2006 | Muthukrishnan et al. |
| 2006/0021633 A1 | 2/2006 | Harvey |
| 2006/0024734 A1 | 2/2006 | Golub et al. |
| 2006/0029971 A1 | 2/2006 | Golub et al. |
| 2006/0040052 A1 | 2/2006 | Fang et al. |
| 2006/0057630 A1 | 3/2006 | Golub et al. |
| 2006/0062917 A1 | 3/2006 | Muthukrishnan et al. |
| 2006/0084283 A1 | 4/2006 | Paranjpe et al. |
| 2006/0148180 A1 | 7/2006 | Ahn et al. |
| 2006/0153995 A1 | 7/2006 | Narwankar et al. |
| 2006/0228895 A1 | 10/2006 | Chae et al. |
| 2006/0246213 A1 | 11/2006 | Moreau et al. |
| 2006/0286819 A1 | 12/2006 | Seutter et al. |
| 2007/0009658 A1 | 1/2007 | Yoo et al. |
| 2007/0009660 A1 | 1/2007 | Sasaki et al. |
| 2007/0023142 A1* | 2/2007 | LaGraff .................... C23F 1/02 156/345.31 |
| 2007/0049043 A1 | 3/2007 | Muthukrishnan et al. |
| 2007/0054487 A1 | 3/2007 | Ma et al. |
| 2007/0065578 A1 | 3/2007 | McDougall |
| 2007/0099415 A1 | 5/2007 | Chen et al. |
| 2007/0134518 A1 | 6/2007 | Feist et al. |
| 2007/0170150 A1* | 7/2007 | Bostanjoglo ............. C23G 5/00 134/2 |
| 2007/0202254 A1 | 8/2007 | Ganguli et al. |
| 2007/0259111 A1 | 11/2007 | Singh et al. |
| 2007/0274837 A1 | 11/2007 | Taylor et al. |
| 2008/0032510 A1 | 2/2008 | Olsen |
| 2008/0038578 A1 | 2/2008 | Li |
| 2008/0056905 A1 | 3/2008 | Golecki |
| 2008/0090425 A9 | 4/2008 | Olsen |
| 2008/0113095 A1 | 5/2008 | Gorman et al. |
| 2008/0135914 A1 | 6/2008 | Krishna et al. |
| 2008/0268154 A1 | 10/2008 | Kher et al. |
| 2008/0268635 A1 | 10/2008 | Yu et al. |
| 2009/0004386 A1 | 1/2009 | Makela et al. |
| 2009/0004850 A1 | 1/2009 | Ganguli et al. |
| 2009/0053426 A1 | 2/2009 | Lu et al. |
| 2009/0061613 A1 | 3/2009 | Choi et al. |
| 2009/0098289 A1 | 4/2009 | Deininger et al. |
| 2009/0098346 A1 | 4/2009 | Li |
| 2009/0155976 A1 | 6/2009 | Ahn et al. |
| 2009/0239061 A1 | 9/2009 | Hazel et al. |
| 2009/0269507 A1 | 10/2009 | Yu et al. |
| 2009/0286400 A1 | 11/2009 | Heo et al. |
| 2010/0062149 A1 | 3/2010 | Ma et al. |
| 2010/0062614 A1 | 3/2010 | Ma et al. |
| 2010/0075499 A1 | 3/2010 | Olsen |
| 2010/0110451 A1 | 5/2010 | Biswas et al. |
| 2010/0120245 A1 | 5/2010 | Tjandra et al. |
| 2010/0159150 A1 | 6/2010 | Kirby et al. |
| 2010/0167527 A1 | 7/2010 | Wu et al. |
| 2010/0239758 A1 | 9/2010 | Kher et al. |
| 2010/0252151 A1 | 10/2010 | Furrer et al. |
| 2010/0270609 A1 | 10/2010 | Olsen et al. |
| 2010/0279018 A1 | 11/2010 | Hazel et al. |
| 2011/0175038 A1 | 7/2011 | Hou et al. |
| 2011/0206533 A1* | 8/2011 | Lee .......................... C23C 10/04 29/889.1 |
| 2011/0293825 A1 | 12/2011 | Atwal et al. |
| 2012/0024403 A1 | 2/2012 | Gage et al. |
| 2012/0040084 A1 | 2/2012 | Fairbourn |
| 2012/0082783 A1 | 4/2012 | Barnett et al. |
| 2012/0148944 A1 | 6/2012 | Oh et al. |
| 2012/0276306 A1 | 11/2012 | Ueda |
| 2012/0318773 A1 | 12/2012 | Wu et al. |
| 2013/0048605 A1 | 2/2013 | Sapre et al. |
| 2013/0164456 A1 | 6/2013 | Winter et al. |
| 2013/0292655 A1 | 11/2013 | Becker et al. |
| 2014/0103284 A1 | 4/2014 | Hsueh et al. |
| 2014/0248288 A1* | 9/2014 | Kumta ..................... C22C 23/04 514/210.05 |
| 2014/0264297 A1 | 9/2014 | Kumar et al. |
| 2014/0271220 A1 | 9/2014 | Leggett |
| 2015/0017324 A1 | 1/2015 | Barnett et al. |
| 2015/0184296 A1 | 7/2015 | Xu et al. |
| 2015/0221541 A1 | 8/2015 | Nemani et al. |
| 2016/0010472 A1 | 1/2016 | Murphy et al. |
| 2016/0060758 A1 | 3/2016 | Marquardt et al. |
| 2016/0181627 A1 | 6/2016 | Roeder et al. |
| 2016/0251972 A1 | 9/2016 | Dierberger |
| 2016/0281230 A1 | 9/2016 | Varadarajan et al. |
| 2016/0298222 A1 | 10/2016 | Meehan et al. |
| 2016/0300709 A1 | 10/2016 | Posseme et al. |
| 2016/0328635 A1 | 11/2016 | Dave et al. |
| 2016/0333493 A1 | 11/2016 | Miettinen et al. |
| 2016/0333494 A1 | 11/2016 | Miettinen et al. |
| 2017/0076968 A1 | 3/2017 | Wang et al. |
| 2017/0084425 A1 | 3/2017 | Uziel et al. |
| 2017/0158978 A1 | 6/2017 | Montagne et al. |
| 2017/0159198 A1 | 6/2017 | Miettinen et al. |
| 2017/0213570 A1 | 7/2017 | Cheng et al. |
| 2017/0233930 A1 | 8/2017 | Keuleers et al. |
| 2017/0292445 A1 | 10/2017 | Nelson et al. |
| 2017/0314125 A1 | 11/2017 | Fenwick et al. |
| 2018/0006215 A1 | 1/2018 | Jeong et al. |
| 2018/0105932 A1 | 4/2018 | Fenwick et al. |
| 2018/0127868 A1 | 5/2018 | Xu et al. |
| 2018/0156725 A1 | 6/2018 | Kessler et al. |
| 2018/0208877 A1* | 7/2018 | Mathews .................. F28G 9/00 |
| 2018/0261516 A1 | 9/2018 | Lin et al. |
| 2018/0261686 A1 | 9/2018 | Lin et al. |
| 2018/0329189 A1 | 11/2018 | Banna et al. |
| 2018/0339314 A1 | 11/2018 | Bhoyar et al. |
| 2018/0351164 A1 | 12/2018 | Hellmich et al. |
| 2018/0358229 A1 | 12/2018 | Koshizawa et al. |
| 2019/0019690 A1 | 1/2019 | Choi et al. |
| 2019/0032194 A2 | 1/2019 | Dieguez-Campo et al. |
| 2019/0079388 A1 | 3/2019 | Fender et al. |
| 2019/0088543 A1 | 3/2019 | Lin et al. |
| 2019/0130731 A1 | 5/2019 | Hassan et al. |
| 2019/0271076 A1 | 9/2019 | Fenwick et al. |
| 2019/0274692 A1 | 9/2019 | Lampropoulos et al. |
| 2019/0284686 A1 | 9/2019 | Melnik et al. |
| 2019/0284692 A1 | 9/2019 | Melnik et al. |

(56) References Cited

U.S. PATENT DOCUMENTS

| | | | |
|---|---|---|---|
| 2019/0284693 | A1 | 9/2019 | Task |
| 2019/0284694 | A1* | 9/2019 | Knisley ............... C23C 16/045 |
| 2019/0287808 | A1 | 9/2019 | Goradia et al. |
| 2019/0311900 | A1 | 10/2019 | Pandit et al. |
| 2019/0311909 | A1 | 10/2019 | Bajaj et al. |
| 2019/0330746 | A1* | 10/2019 | Britz ................. C23C 28/3455 |
| 2019/0382879 | A1 | 12/2019 | Jindal et al. |
| 2020/0027767 | A1 | 1/2020 | Zang et al. |
| 2020/0043722 | A1 | 2/2020 | Cheng et al. |
| 2020/0048584 | A1* | 2/2020 | Takahashi ......... H01L 21/02063 |
| 2020/0240018 | A1 | 7/2020 | Melnik et al. |
| 2020/0340107 | A1 | 10/2020 | Chatterjee et al. |
| 2020/0361124 | A1 | 11/2020 | Britz |
| 2020/0392626 | A1 | 12/2020 | Chatterjee et al. |
| 2021/0292901 | A1 | 9/2021 | Knisley et al. |

FOREIGN PATENT DOCUMENTS

| | | | |
|---|---|---|---|
| EP | 0387113 | B1 | 12/1993 |
| EP | 1431372 | A2 | 6/2004 |
| EP | 1236812 | B1 | 5/2006 |
| EP | 2022868 | A2 | 2/2009 |
| EP | 2103707 | A1 | 9/2009 |
| EP | 2194164 | A1 | 6/2010 |
| EP | 2392895 | A1 | 12/2011 |
| EP | 2161352 | B1 | 2/2014 |
| EP | 3540092 | A1 | 9/2019 |
| GB | 2401115 | A * 11/2004 ............ C23C 10/60 |
| JP | 2823086 | B2 | 11/1998 |
| JP | 2001342556 | A | 12/2001 |
| JP | 2003013745 | A | 1/2003 |
| JP | 2003164819 | A | 6/2003 |
| JP | 2006010403 | A | 1/2006 |
| JP | 2006199988 | A | 8/2006 |
| KR | 20060106104 | A | 10/2006 |
| KR | 20110014989 | A | 2/2011 |
| KR | 101192248 | B1 | 10/2012 |
| KR | 20170063149 | A | 6/2017 |
| KR | 101761736 | B1 | 7/2017 |
| KR | 20170140354 | A | 12/2017 |
| RU | 2630733 | C2 | 9/2017 |
| TW | 201812075 | A | 4/2018 |
| WO | 9631687 | A1 | 10/1996 |
| WO | 00/09778 | A1 | 2/2000 |
| WO | 2005059200 | A1 | 6/2005 |
| WO | 2014159267 | A1 | 10/2014 |
| WO | 2015047783 | A1 | 4/2015 |
| WO | 2019182967 | A1 | 9/2019 |

OTHER PUBLICATIONS

Kaushik, Yashpal, et al., "A Review on Use of Aluminium Alloys in Aircraft Components", i-manager's Journal on Material Science, vol. 3 No. 3, Oct.-Dec. 2015, pp. 33-38.*

Martínez-Viademonte, Mariana Paz, et al., "A Review on Anodizing of Aerospace Aluminum Alloys for Corrosion Protection". Coatings, 2020, 10, 1106, pp. 1-30.*

Le Guevel, Y., et al., "Dissolution and passivation of aluminide coatings on model and Ni-based superalloy". Surface and Coatings Technology 357 (2019) 1037-1047.*

Pollock, Tresa M., et al., "Nickel-Based Superalloys for Advanced Turbine Engines: Chemistry, Microstructure, and Properties". Journal of Propulsion and Power vol. 22, No. 2, Mar.-Apr. 2006, pp. 361-374.*

Lang "The Role of Active Elements in the Oxidation Behaviour of High Temperature Metals and Alloys" Elsevier, 1989, pp. 111-129 and 153.

International Search Report and Written Opinion dated Jul. 2, 2019 for Application No. PCT/US2019/022788.

International Search Report and Written Opinion for International Application No. PCT/US2019/022737 dated Jul. 2, 2019, 11 pages.

"A Review on Alumina-Chrome (Al2O3-Cr2O3) and Chrome-Silica (Cr2O3-SiO2) Refractories along with their Binary Phase Diagrams," Nov. 18, 2009, 6 pages, <http://www.idc-online.com/technical_references/pdfs/chemical_engineering/A_Review_on_Alumina_Chrome.pdf>.

Bensch et al. "Modeling of the Influence of Oxidation of Thin-Walled Specimens of Single Crystal Superalloys," Superalloys 2012: 12th International Symposium on Superalloys, The Minerals, Metals & Materials Society, pp. 331-340, <https://www.tms.org/superalloys/10.7449/2012/Superalloys_2012_331_340.pdf>.

Fujita et al. "Sintering of Al2O3-Cr2O3 Powder Prepared by Sol-Gel Process," Journal of the Society of Materials Science, Japan, vol. 56, No. 6, Jun. 2007, pp. 526-530, <http://www.ecm.okayama-u.ac.jp/ceramics/Research/Papers/2007/Fujita_JSMS56(2007)526.pdf>.

Hirata et al. "Corrosion Resistance of Alumina-Chromia Ceramic Materials against Molten Slag," Materials Transactions, vol. 43, No. 10, 2002, pp. 2561-2567, <https://www.jim.or.jp/journal/e/pdf3/43/10/2561.pdf>.

Knisley et al. "Volatility and High Thermal Stability in Mid to Late First Row Transition Metal Diazadienyl Complexes," Organometallics, 2011, vol. 30, No. 18, pp. 5010-5017.

Pettit et al. "Oxidation and Hot Corrosion of Superalloys," Jan. 1984, The Metal Society AIME, Warrendale, PA, pp. 651-687, <http://www.tms.org/superalloys/10.7449/1984/Superalloys_1984_651_687.pdf>.

He et al. "Role of annealing temperatures on the evolution of microstructure and properties of Cr2O3 films," Applied Surface Science, vol. 357, Part B, Dec. 1, 2015, pp. 1472-1480, <https://doi.org/10.1016/j.apsusc.2015.10.023>.

International Search Report and Written Opinion for International Application No. PCT/US2019/022709 dated Jun. 28, 2019, 13 pages.

Kaloyeros et al. "Review-Silicon Nitrtide and Silicon Nitride-Rich Thin Film Technologies: Trends in Deposition Technniques and Related Application". ECS Journal of Solid State Science and Technology, 6 (10) p. 691-p. 714 (2017).

Heidary et al. "Study on the behavior of atomic layer deposition coatings on a nickel substrate at high temperature," Nanotechnology, 27, 245701, 2016, pp. 1-32.

Vargas Garcia et al. "Thermal barrier coatings produced by chemical vapor deposition," Science and Technology of Advanced Materials, vol. 4, No. 4, 2003, pp. 397-402.

Dyer et al. "CVD Tungsten Carbide and Titanium Carbide Coatings for Aerospace Components," SAE Transactions, vol. 98, Section 1: Journal of Aerospace (1989), pp. 64-70. Abstract Only.

International Search Report and Written Opinion dated Jul. 6, 2020 for Application No. PCT/US2020/024285.

Tsai, S.C. et al., "Growth mechanism of Cr2O3 scales: oxygen and chromium diffusion, oxidation kinetics and effect of yttrium", Elsevier, 1996, pp. 6-13.

PCT Notification of Transmittal of the International Search Report and the Written Opinion of the International Searching Authority for International Application No. PCT/US2019/019113; dated Jun. 10, 2019; 11 total pages.

Taiwan Office Action dated Apr. 22, 2020 for Application No. 108106406.

PCT International Search Report and the Written Opinion for International Application No. PCT/US2019/041181; dated Oct. 25, 2019; 15 total pages.

Taiwan Office Action dated Dec. 21, 2020 for Application No. 109113600.

International Search Report and Written Opinion dated Feb. 2, 2021 for Application No. PCT/US2020/056618.

International Search Report and Written Opinion dated Jun. 24, 2020 for Application No. PCT/US2020/019151.

Liu et al., "Ultrathin high-temperature oxidation-resistant coatings of hexagonal boron nitride" Nature Communications; doi: 10.1038/ncomms3541; Pub. Oct. 4, 2013, 8 pages.

Calderon, "Boron Nitride Growth and Electronics", Cornell University, May 2018.

(56) References Cited

OTHER PUBLICATIONS

W. Auwarter, "Hexagonal boron nitride monolayers on metal supports: Versatile templates for atoms, molecules and nanostructures", Surface Science Reports 74 (2019) 1-95.
International Search Report and Written Report dated Jul. 31, 2020 for Application No. PCT/US2020/027247.
International Search Report and the Written Opinion for International Application No. PCT/US2020/028462 dated Jul. 29, 2020, 11 pages.
Leppaniemi, Jarmo, et al., "Corrosion protection of steel with multilayer coatings: Improving the sealing properties of physical vapor deposition CrN coatings with Al2O3/TiO2 atomic layer deposition nanolaminates". Thin Solid Films 627 (2017) pp. 59-68.
Ali, Muhammad Rostom, et al., "Electrodeposition of aluminum-chromium alloys from Al&BPC melt and its corrosion and high temperature oxidation behaviors". Electrochimica Acta, vol. 42. No. 15., pp. 2347-2354, 1997.
Wu, Yanlin, et al., "Atomic Layer Deposition from Dissolved Precursors". Nano Letters 2015, 15, 6379-6385.
Johnson, Andrew L., et al., "Recent developments in molecular precursors for atomic layer deposition". Organomet. Chem., 2019, 42, 1-53.
Haukka, Suvi, et al., "Chemisorption of chromium acetylacetonate on porous high surface area silica". Applied Surface Science, vol. 75, Issues 1-4, Jan. 2, 1994, pp. 220-227. Abstract Only.
International Search Report and Written Opinion dated Oct. 30, 2020 for Application No. PCT/US2020/041382.
Taiwan Office Action dated May 10, 2021 for Application No. 109126499.
European Search Report dated Jul. 26, 2021 for Application No. 19793402.9.
International Search Report and Written Opinion dated Sep. 28, 2021 for Application No. PCT/US2021/035874.
Extended European Search Report dated Oct. 4, 2021 for Application No. 19793402.9.
Partial Supplementary European Search Report dated Feb. 10, 2022 for Application No. 19770951.2.
Taiwan Office Action dated Oct. 7, 2021 for Application No. 109126499.
Extended European Search Report dated Feb. 28, 2022 for Application No. 19771810.9.
International Search Report dated Dec. 1, 2021 for Application No. PCT/US2021/046245.
International Search Report and Written Opinion dated Dec. 2, 2021 for Application No. PCT/US2021/045766.
Wang et al., "Hydrogen permeation properties of CrxCy@Cr2O3/Al2O3 composite coating derived from selective oxidation of a Cr-C alloy and atomic layer deposition", International Journal of Hydrogen Energy, 43 (2018) pp. 21133-21141.
Liu et al., "Microstructural evolution of the interface between NiCrAlY coating and superalloy during isothermal oxidation", Materials and Design, 80 (2015) pp. 63-69.

\* cited by examiner

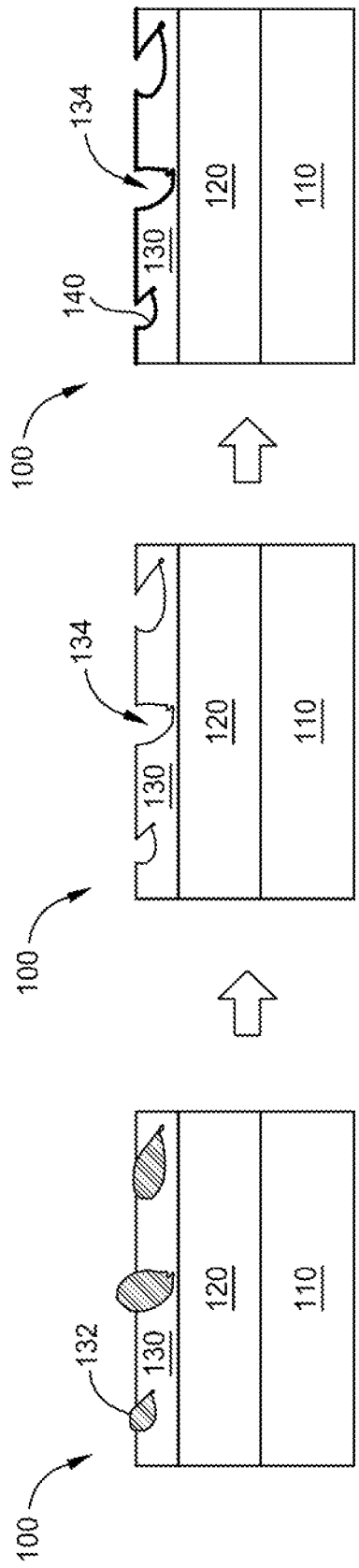

```
                      200B ─┐
                            ↘

┌─────────────────────────────────────────────────────────────┐
    │ 1: COMBINATION OF DEIONIZED WATER AND ORGANIC SOLVENT       │
    │    SONICATION AT RT FOR 30 MINUTES                          │
    └─────────────────────────────────────────────────────────────┘
                   DRYING WITH N₂-GUN  ⇩
    ┌─────────────────────────────────────────────────────────────┐
    │ 2: COMBINATION OF CHELATING AGENT AND ALKALINE              │
    │    SOLUTION SONICATION AT RT 3 HOURS                        │
    └─────────────────────────────────────────────────────────────┘
                   DRYING WITH N₂-GUN  ⇩
    ┌─────────────────────────────────────────────────────────────┐
    │ 3: COMBINATION OF DEIONIZED WATER AND ORGANIC SOLVENT       │
    │    SONICATION AT RT FOR 60 MINUTES                          │
    └─────────────────────────────────────────────────────────────┘
                   DRYING WITH N₂-GUN  ⇩
    ┌─────────────────────────────────────────────────────────────┐
    │ 4: FORM A PROTECTIVE COATING ON THE FIRST AND SECOND        │
    │    PORTIONS OF THE ALUMINUM OXIDE LAYER                     │
    └─────────────────────────────────────────────────────────────┘
```

FIG. 2B

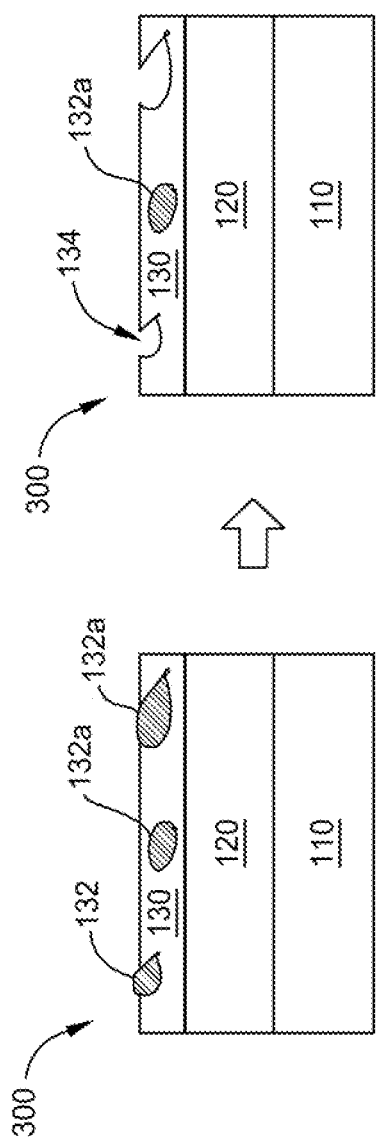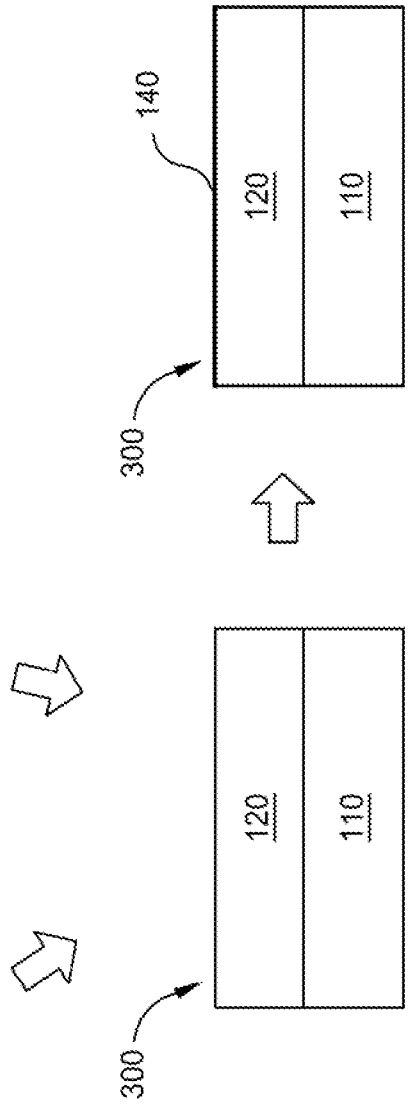

400A

```
┌─────────────────────────────────────────────────────────────┐
│ EXPOSE AEROSPACE COMPONENT CONTAINING CORROSION TO          │
│ AN ACIDIC CLEANING SOLUTION, THE AEROSPACE COMPONENT        │
│ CONTAINS A NICKEL SUPERALLOY, AN ALUMINIDE LAYER DISPOSED   │─ 410
│ ON THE NICKEL SUPERALLOY, AND AN ALUMINUM OXIDE LAYER       │
│ DISPOSED ON THE ALUMINIDE LAYER, AND THE CORROSION IS       │
│ CONTAINED ON AND WITHIN THE ALUMINUM OXIDE LAYER            │
└─────────────────────────────────────────────────────────────┘
                              │
┌─────────────────────────────────────────────────────────────┐
│ REMOVE THE CORROSION AND THE ALUMINUM OXIDE LAYER           │
│ WITH THE ACIDIC CLEANING SOLUTION TO REVEAL THE             │─ 420
│ ALUMINIDE LAYER                                             │
└─────────────────────────────────────────────────────────────┘
                              │
┌─────────────────────────────────────────────────────────────┐
│ EXPOSE THE ALUMINIDE LAYER TO A RINSE                       │─ 430
└─────────────────────────────────────────────────────────────┘
                              │
┌─────────────────────────────────────────────────────────────┐
│ DRY THE AEROSPACE COMPONENT                                 │─ 440
└─────────────────────────────────────────────────────────────┘
                              │
┌─────────────────────────────────────────────────────────────┐
│ FORM A PROTECTIVE COATING ON THE SECOND PORTION             │─ 450
│ OF THE ALUMINIDE LAYER                                      │
└─────────────────────────────────────────────────────────────┘
```

```
┌─────────────────────────────────────────────────────────┐
│ 1: COMBINATION OF DEIONIZED WATER AND ORGANIC SOLVENT   │
│    SONICATION AT RT FOR 30 MINUTES                      │
└─────────────────────────────────────────────────────────┘
                 DRYING WITH N₂-GUN ⬇
┌─────────────────────────────────────────────────────────┐
│ 2: COMBINATION OF CHELATING AGENT AND ALKALINE          │
│    SOLUTION SONICATION AT RT 3 HOURS                    │
└─────────────────────────────────────────────────────────┘
                 DRYING WITH N₂-GUN ⬇
┌─────────────────────────────────────────────────────────┐
│ 3: DEIONIZED WATER CLEANING                             │
└─────────────────────────────────────────────────────────┘
                 DRYING WITH N₂-GUN ⬇
┌─────────────────────────────────────────────────────────┐
│ 4: 10-40%(V/V) ACIDIC CLEANING WITH MECHANICAL STIRRING │
│    AT 50-100°C FOR 1 HOUR                               │
└─────────────────────────────────────────────────────────┘
                 DRYING WITH N₂-GUN ⬇
┌─────────────────────────────────────────────────────────┐
│ 5: DEIONIZED WATER SONICATION AT RT 1 HOUR              │
└─────────────────────────────────────────────────────────┘
                 DRYING WITH N₂-GUN ⬇
┌─────────────────────────────────────────────────────────┐
│ 6: COMBINATION OF CHELATING AGENT AND ALKALINE          │
│    SOLUTION SONICATION AT RT 3 HOURS                    │
└─────────────────────────────────────────────────────────┘
                 DRYING WITH N₂-GUN ⬇
┌─────────────────────────────────────────────────────────┐
│ 7: COMBINATION OF DEIONIZED WATER AND ORGANIC SOLVENT   │
│    SONICATION AT RT FOR 60 MINUTES                      │
└─────────────────────────────────────────────────────────┘
                 DRYING WITH N₂-GUN ⬇
┌─────────────────────────────────────────────────────────┐
│ 8: FORM A PROTECTIVE COATING ON THE SECOND PORTION      │
│    OF THE ALUMINIDE LAYER                               │
└─────────────────────────────────────────────────────────┘
```

FIG. 4B

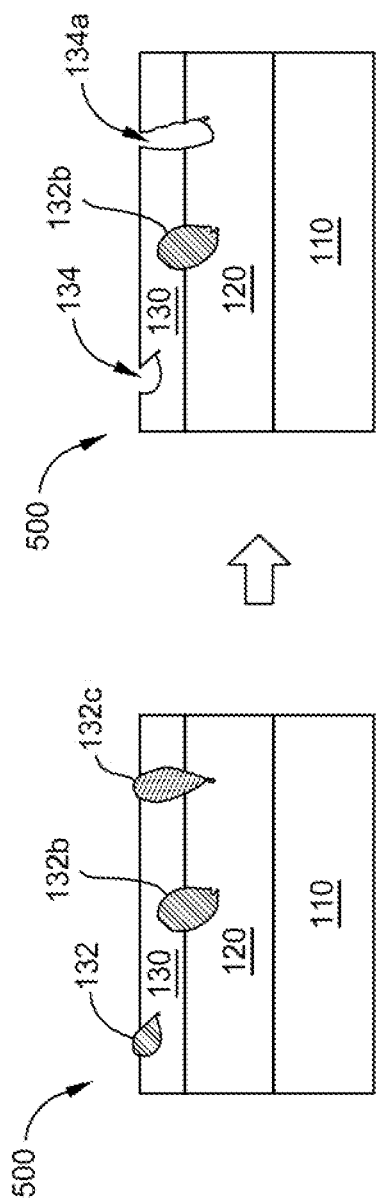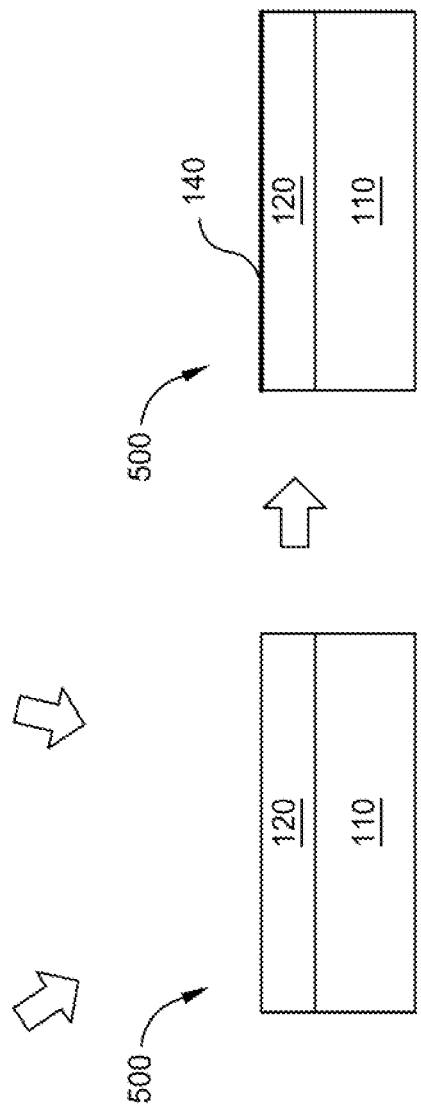

600A

610 — EXPOSE AEROSPACE COMPONENT CONTAINING CORROSION TO AN ACIDIC CLEANING SOLUTION, THE AEROSPACE COMPONENT CONTAINS A NICKEL SUPERALLOY, AN ALUMINIDE LAYER DISPOSED ON THE NICKEL SUPERALLOY, AND AN ALUMINUM OXIDE LAYER DISPOSED ON THE ALUMINIDE LAYER, AND THE CORROSION IS CONTAINED ON AND THE ALUMINUM OXIDE LAYER AND WITHIN THE ALUMINUM OXIDE LAYER AND A FIRST PORTION OF THE ALUMINIDE LAYER

620 — REMOVE THE CORROSION, THE ALUMINUM OXIDE LAYER, AND THE FIRST PORTION OF THE ALUMINIDE LAYER WITH THE ACIDIC CLEANING SOLUTION TO REVEAL A SECOND PORTION OF THE ALUMINIDE LAYER

630 — EXPOSE THE AEROSPACE COMPONENT TO A RINSE

640 — DRY THE AEROSPACE COMPONENT

650 — FORM A PROTECTIVE COATING ON THE SECOND PORTION OF THE ALUMINIDE LAYER

```
1: COMBINATION OF DEIONIZED WATER AND ORGANIC SOLVENT
   SONICATION AT RT FOR 30 MINUTES
```
⇩ DRYING WITH $N_2$-GUN

```
2: COMBINATION OF CHELATING AGENT AND ALKALINE
   SOLUTION SONICATION AT RT 3 HOURS
```
⇩ DRYING WITH $N_2$-GUN

```
3: DEIONIZED WATER CLEANING
```
⇩ DRYING WITH $N_2$-GUN

```
4: 10-40%(V/V) ACIDIC OR MIXTURE OF ACIDS CLEANING WITH
   MECHANICAL STIRRING AT RT FOR 1 HOUR
```
⇩ DRYING WITH $N_2$-GUN

```
5: DEIONIZED WATER CLEANING
```
⇩ DRYING WITH $N_2$-GUN

```
6: COMBINATION OF CHELATING AGENT AND ALKALINE
   SOLUTION SONICATION AT RT 3 HOURS
```
⇩ DRYING WITH $N_2$-GUN

```
7: COMBINATION OF DEIONIZED WATER AND ORGANIC SOLVENT
   SONICATION AT RT FOR 60 MINUTES
```
⇩ DRYING WITH $N_2$-GUN

```
8: FORM A PROTECTIVE COATING ON THE SECOND PORTION
   OF THE ALUMINIDE LAYER
```

FIG. 6B

METHODS FOR REFURBISHING AEROSPACE COMPONENTS

CROSS-REFERENCE TO RELATED APPLICATIONS

This application claims benefit to Indian Provisional Appl. No. 202041028360, filed Jul. 3, 2020, which is incorporated herein by reference in its entirety.

BACKGROUND

Field

Embodiments of the present disclosure generally relate to cleaning and deposition processes, and in particular to cleaning processes for aerospace components and vapor deposition processes for depositing films on aerospace components.

Description of the Related Art

Aerospace components, such as turbine engines, typically have parts or components which corrode or degrade over time due to being exposed to hot gases and/or reactive chemicals (e.g., acids, bases, or salts). Such aerospace components are often protected by a thermal and/or chemical barrier coating. The current coatings used on airfoils exposed to the hot gases of combustion in gas turbine engines for both environmental protection and as bond coats in thermal barrier coating (TBC) systems include both diffusion aluminides and various metal alloy coatings. These coatings are applied over substrate materials, typically nickel-based superalloys, to provide protection against oxidation and corrosion attack. These protective coatings are formed on the substrate in a number of different ways and can include a metal aluminide layer and/or aluminum oxide layer. For example, a nickel aluminide layer may be grown as an outer coat on a nickel superalloy by simply exposing the substrate to an aluminum rich environment at elevated temperatures. The aluminum diffuses into the substrate and combines with the nickel to form an outer surface of the nickel-aluminum alloy. Aluminum oxide layers are typically grown, deposited, or otherwise formed on top of the metal aluminide layers when in a relatively high temperature environment with oxygen.

Corrosion can occur on the aerospace component and continue to expand through different phases. Corrosion can be on or within any of the protective coatings and/or can be on the base metal, such as the nickel superalloy. Typically, an aerospace component containing corrosion is replaced and discarded—such as scrapped, recycled, or buried in a landfill.

Therefore, there needs to be a method for refurbishing aerospace components, more specifically, methods for clean aerospace components and methods for depositing the protective coatings on aerospace components are needed.

SUMMARY

Embodiments of the present disclosure generally relate to cleaning processes for aerospace components and methods for depositing protective coatings on the aerospace components. In one or more embodiments, a method of refurbishing an aerospace component includes exposing the aerospace component containing corrosion to an aqueous cleaning solution. The aerospace component contains a nickel superalloy, an aluminide layer disposed on the nickel superalloy, and an aluminum oxide layer disposed on the aluminide layer. In one or more embodiments, the corrosion (e.g., Phase corrosion) is contained on a first or upper portion of the aluminum oxide layer while a second or lower portion of the aluminum oxide layer is free of the corrosion. The method also includes removing the corrosion from the first portion of the aluminum oxide layer with the aqueous cleaning solution to reveal the first portion of the aluminum oxide layer, then exposing the first and second portions of the aluminum oxide layer to a post-rinse, and forming a protective coating on the first and second portions of the aluminum oxide layer.

In other embodiments, a method of refurbishing an aerospace component includes exposing the aerospace component containing corrosion to an acidic cleaning solution containing, for example, sulfuric acid. The aerospace component contains a nickel superalloy, an aluminide layer disposed on the nickel superalloy, and an aluminum oxide layer disposed on the aluminide layer. The corrosion (e.g., Phase 2 corrosion) is contained on and within the aluminum oxide layer. The method also includes removing the corrosion and the aluminum oxide layer with the acidic cleaning solution to reveal the aluminide layer, then exposing the aluminide layer to a post-rinse, and forming a protective coating on the aluminide layer.

In some embodiments, a method of refurbishing an aerospace component includes exposing the aerospace component containing corrosion to an acidic cleaning solution containing, for example, hydrogen fluoride and nitric acid. The aerospace component contains a nickel superalloy, an aluminide layer disposed on the nickel superalloy, and an aluminum oxide layer disposed on the aluminide layer. The corrosion (e.g., Phase 3 corrosion) is contained on the aluminum oxide layer and within the aluminum oxide layer and a first portion of the aluminide layer. The method also includes removing the corrosion, the aluminum oxide layer, and the first portion of the aluminide layer with the acidic cleaning solution to reveal a second portion of the aluminide layer, then exposing the aerospace component to a post-rinse, and forming a protective coating on the second portion of the aluminide layer.

A refurbished aerospace component is produced or formed by any one of the methods described and discussed herein. Exemplary aerospace components can be or include a turbine blade, a turbine blade root, a turbine disk, a turbine vane, a support member, a frame, a rib, a fin, a pin fin, a fuel nozzle, a fuel line, a fuel valve, a combustor liner, a combustor shield, a heat exchanger, or an internal cooling channel.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 1A-1C depict schematic views of an aerospace component having corrosion and being treated at different stages or operations of a refurbishing process, according to one or more embodiments described and discussed herein.

FIGS. 2A-2B are flow charts illustrating different stages or operations of the refurbishing process depicted in FIGS. 1A-1C, according to one or more embodiments described and discussed herein.

FIGS. 3A-3D depict schematic views of an aerospace component having corrosion and being treated at different stages or operations of another refurbishing process, according to one or more embodiments described and discussed herein.

FIGS. 4A-4B are flow charts illustrating different stages or operations of the refurbishing process depicted in FIGS. 3A-3D, according to one or more embodiments described and discussed herein.

FIGS. 5A-5D depict schematic views of an aerospace component having corrosion and being treated at different stages or operations of another refurbishing process, according to one or more embodiments described and discussed herein.

FIGS. 6A-6B are flow charts illustrating different stages or operations of the refurbishing process depicted in FIGS. 5A-5D, according to one or more embodiments described and discussed herein.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to cleaning processes for aerospace components and methods for depositing protective coatings on the aerospace components. The main body of the aerospace component typically contains nickel, such as a nickel alloy or a nickel superalloy. On the inner and/or outer surfaces of the main body, the aerospace component can have an initial or first protective coating of one or more layers, such as one or more metal aluminide layers disposed on the nickel superalloy and one or more aluminum oxide layers disposed on the metal aluminide layer. In some embodiments, the aerospace component as described and discussed herein can be or include one or more turbine blades, turbine blade roots (e.g., fir tree or dovetail), turbine disks, turbine vanes, internal cooling channels, support members, frames, ribs, fins, pin fins, fuel nozzles, combustor liners, combustor shields, heat exchangers, fuel lines, fuel valves, or any other aerospace component or part that can benefit from having corrosion removed and a protective coating deposited thereon. The initial protective coatings can be deposited or otherwise formed on interior surfaces and/or exterior surfaces of the aerospace components.

Corrosion on the aerospace component occurs in various phases and reaches different depths of the initial protective coating on the aerospace component until the corrosion reaches and damages the underlying aerospace component. In one or more examples, the aerospace component has an initial protective coating which contains an outer layer of aluminum oxide and an inner layer of metal aluminide layer disposed on the nickel superalloy surface of the aerospace component body. Methods described and discussed herein remove corrosion at multiple phases. In Phase 1, the corrosion is contained on a first portion of the aluminum oxide layer while a second portion of the aluminum oxide layer and all of the metal aluminide layer are free of the corrosion. In Phase 2, the corrosion has progressed and includes the corrosion of Phase 1 and also includes corrosion of the second portion of the aluminum oxide layer, while all of the metal aluminide layer is free of the corrosion. In Phase 3, the corrosion has progressed and includes the corrosion of Phases 1 and 2 and also includes corrosion of the metal aluminide layer. In Phases 1-3, the nickel superalloy surface of the aerospace component body remains free of corrosion. In Phase 4, the corrosion has progressed and includes the corrosion of Phases 1-3 and also includes corrosion of the nickel superalloy of the aerospace component body.

Figure 2A:
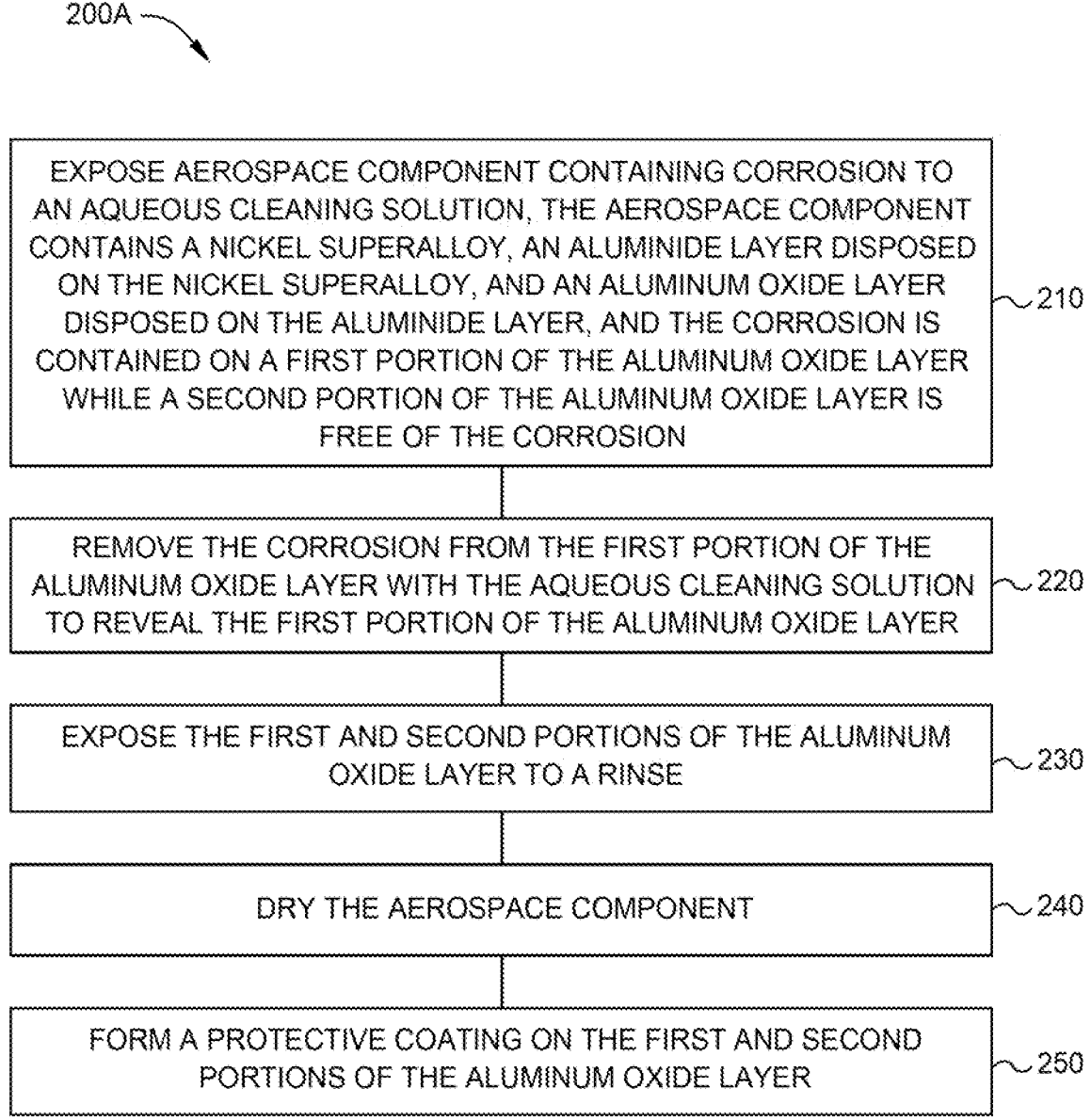

FIGS. 1A-1C depict schematic views of a workpiece 100 containing an aerospace component 110 having corrosion at Phase 1 and being treated at different stages or operations of a refurbishing process. FIG. 2A is a flow chart illustrating a method 200A, a refurbishing process, which includes some of the different stages or operations 210-250 of the refurbishing process performed on the workpiece 100 depicted in FIGS. 1A-1C.

The workpiece 100 has one or more aluminide layers 120 disposed on the nickel superalloy surface of the aerospace component 110 and one or more aluminum oxide layers 130 disposed on the aluminide layer 120, as depicted in FIG. 1A. Corrosion 132 is contained on a first portion of the aluminum oxide layer 130 while a second portion of the aluminum oxide layer 130 is free of the corrosion 132. For example, the first portion of the aluminum oxide layer 130 contains the corrosion 132 while the second portion of the aluminum oxide layer 130 is substantially or completely free of the corrosion 132. The corrosion 132 is at and on the upper surface of the aluminum oxide layer 130 and extends into the first portion of the aluminum oxide layer 130. The aluminide layer 120 and the superalloy of the aerospace component 110 are both substantially or completely free of the corrosion 132 at Phase 1 of the corrosion.

The aluminide layer 120 contains one or more metal aluminides which can be or include nickel aluminide, titanium aluminide, magnesium aluminide, iron aluminide, or combinations thereof. The aluminide layer 120 has a thickness of about 10 µm, about 20 µm, about 30 µm, about 50 µm, about 80 µm, or about 100 µm to about 120 µm, about 150 µm, about 180 µm, about 200 µm, about 250 µm, about 300 µm, about 400 µm, about 500 µm, about 700 µm, or thicker. For example, the aluminide layer 120 has a thickness of about 10 µm to about 700 µm, about 20 µm to about 700 µm, about 20 µm to about 500 µm, about 20 µm to about 300 µm, about 20 µm to about 200 µm, about 20 µm to about 150 µm, about 20 µm to about 100 µm, about 20 µm to about 50 µm, about 50 µm to about 700 µm, about 50 µm to about 500 µm, about 50 µm to about 300 µm, about 50 µm to about 200 µm, about 50 µm to about 150 µm, about 50 µm to about 100 µm, about 50 µm to about 80 µm, about 100 µm to about 700 µm, about 100 µm to about 500 µm, about 100 µm to about 300 µm, about 100 µm to about 200 µm, about 100 µm to about 150 µm, or about 100 µm to about 120 µm.

The aluminum oxide 130 can include fully oxidized aluminum, such as $Al_2O_3$ and/or less oxidized aluminum, such as $AlO_x$, where x is from about 0.1 to less than 1.5, about 0.5 to about 1.4, about 0.8 to about 1.2, about 0.9 to about 1.1, or about 1. The aluminum oxide 130 has a thickness of about 1 µm, about 2 µm, about 3 µm, about 4 µm, about 5 µm, about 8 µm, or about 10 µm to about 12 µm, about 15 µm, about 20 µm, about 30 µm, about 50 µm, about 80 µm, or about 100 µm. For example, the aluminum oxide 130 has a thickness of about 1 µm to about 100 µm, about 1 μm to about 80 μm, about 1 μm to about 50 μm, about 1 μm to about 30 μm, about 1 μm to about 20 μm, about 1 μm to about 15 μm, about 1 μm to about 10 μm, about 1 μm to about 5 μm, about 5 μm to about 100 μm, about 5 μm to about 80 μm, about 5 μm to about 50 μm, about 5 μm to about 30 μm, about 5 μm to about 20 μm, about 5 μm to about 15 μm, about 5 μm to about 10 μm, about 5 μm to about 8 μm, about 10 μm to about 100 μm, about 10 μm to about 80 μm, about 10 μm to about 50 μm, about 10 μm to about 30 μm, about 10 μm to about 20 μm, about 10 μm to about 15 μm, about 10 μm to about 12 μm, about 2 μm to about 20 μm, about 3 μm to about 10 μm, or about 4 μm to about 8 μm.

In some embodiments, prior to exposing the workpiece 100 containing the aerospace component 110 to the aqueous cleaning solution to remove the corrosion at operation 210, the workpiece 100 can be exposed to a pre-rinse. The pre-rinse contains one or more organic solvents and water. Exemplary organic solvents can be or include acetone, methanol, ethanol, isopropanol, pentane, hexane, diethyl ether, or combinations thereof. The pre-rinse can include about 10 vol %, about 20 vol %, about 30 vol %, about 40 vol %, or about 50 vol % to about 60 vol %, about 70 vol %, about 80 vol %, about 90 vol %, or about 100 vol % of the solvent and the remainder is water. In one or more examples, the pre-rinse contains a 1:1 mixture of acetone to deionized water.

The pre-rinse lasts for about 5 minutes to about 60 minutes, about 10 minutes to about 50 minutes, about 15 minutes to about 45 minutes, about 20 minutes to about 40 minutes, or about 30 minutes. The workpiece 100 can be sonicated while in the pre-rinse. The pre-rinse can be heated and/or maintained at a temperature of about 20° C., about 22° C., about 25° C., about 30° C. to about 35° C., about 40° C., about 50° C., about 80° C., or about 100° C. For example, the pre-rinse can be heated and/or maintained at a temperature of about 20° C. to about 100° C., about 20° C. to about 50° C., or about 20° C. to about 30° C., such as at a room temperature of about 22° C. or about 23° C. After the pre-rinse, the workpiece 100 can optionally be dried, such as air dried at ambient temperature and pressure in the air or exposed to a flow of air, nitrogen ($N_2$), argon, or a mixture thereof from a blower, a fan, or the like at an ambient or heated temperature.

In one or more embodiments, the method 200 of refurbishing an aerospace component 110 includes exposing the workpiece 100 containing corrosion 132 to an aqueous cleaning solution at operation 210. As depicted in FIG. 1A, the corrosion 132 (e.g., Phase 1 corrosion 132) is contained on the first portion of the aluminum oxide layer 130 while the second portion of the aluminum oxide layer 130 is free of the corrosion 132. At operation 220, the corrosion 132 is removed from the first portion of the aluminum oxide layer 130 with the aqueous cleaning solution to reveal the first portion of the aluminum oxide layer 130, as depicted in FIG. 1B. The first portion of the aluminum oxide layer 130 is typically within one or more voids or spaces 134 formed in the aluminum oxide layer 130 below the upper surface of the aluminum oxide layer 130.

The aqueous cleaning solution contains water, one or more chelators or complexing agents, and one or more bases (e.g., hydroxide). Exemplary chelators or complexing agents can be or include oxalic acid, citric acid, bipyridine, o-phenylenediamine, ethylenediamine (EDA), nitrilotriacetic acid (NTA), Iminodiacetic acid, picolinic acid, (1,1,1)-trifluoroacetylacetone, 1,4,7-triazacyclononane (TACN), (N,N,N',N'-tetrakis(2-pyridinylmethyl)-1,2-ethanediamine (TPEN), ethylenediaminetetraacetic acid (EDTA), ethylenediaminediacetic acid (EDDA), ethylenediamine-N,N'-disuccinic acid (EDDS), ethylenediamine-N,N'-bis(2-hydroxyphenylacetic acid) (EDDHA), 1,4,7,10-tetraazacyclododecane-1, 4,7,10-tetraacetic acid (DOTA, 1,2-bis(o-aminophenoxy) ethane-N,N,N',N'-tetraacetic acid) (BAPTA), aminoethylethanolamine (AEEA), thenoyltrifluoroacetone, salts thereof, adducts thereof, complexes thereof, or any combination thereof. Bases are used to increase the pH of the aqueous cleaning solution and can be or include inorganic bases and/or organic bases. In some examples, one or more hydroxides are used as the base. Exemplary hydroxides can be or include sodium hydroxide, potassium hydroxide, lithium hydroxide, cesium hydroxide, ammonium hydroxide, or any combination thereof. In one or more examples, the complexing agent can be or include ethylenediaminetetraacetic acid (EDTA) and/or a salt thereof and the base can be or include one or more hydroxides.

At operations 210 and 220, workpiece 100 containing the aerospace component 110 is exposed to the aqueous cleaning solution for about 0.5 hours, about 0.8 hours, about 1 hour, or about 1.5 hours to about 2 hours, about 2.5 hours, about 3 hours, about 4 hours, about 5 hours, or longer. For example, workpiece 100 is exposed to the aqueous cleaning solution for about 0.5 hours to about 5 hours, about 1 hour to about 5 hours, about 2 hours to about 5 hours, about 2.5 hours to about 5 hours, about 3 hours to about 5 hours, about 4 hours to about 5 hours, about 0.5 hours to about 4 hours, about 1 hour to about 4 hours, about 2 hours to about 4 hours, about 2.5 hours to about 4 hours, about 3 hours to about 4 hours, about 0.5 hours to about 3 hours, about 1 hour to about 3 hours, about 2 hours to about 3 hours, or about 2.5 hours to about 3 hours. The workpiece 100 can be sonicated while in the aqueous cleaning solution.

The aqueous cleaning solution can be heated and/or maintained at a temperature of about 20° C., about 22° C., about 25° C., about 30° C. to about 35° C., about 40° C., about 50° C., about 80° C., or about 100° C. For example, the aqueous cleaning solution can be heated and/or maintained at a temperature of about 20° C. to about 100° C., about 20° C. to about 50° C., or about 20° C. to about 30° C., such as at a room temperature of about 22° C. or about 23° C. After operation 220 and before operation 230, the workpiece 100 can optionally be dried, such as air dried at ambient temperature and pressure in the air or exposed to a flow of air, nitrogen ($N_2$), argon, or a mixture thereof from a blower, a fan, or the like at an ambient or heated temperature.

In one or more embodiments, subsequent to operation 220, the workpiece 100 including the first and second portions of the aluminum oxide layer 130 can be exposed to a post-rinse at operation 230. The post-rinse contains one or more organic solvents and water. Exemplary organic solvents can be or include acetone, methanol, ethanol, isopropanol, pentane, hexane, diethyl ether, or combinations thereof. The post-rinse can include about 10 vol %, about 20 vol %, about 30 vol %, about 40 vol %, or about 50 vol % to about 60 vol %, about 70 vol %, about 80 vol %, about 90 vol %, or about 100 vol % of the solvent and the remainder is water. In one or more examples, the post-rinse contains a 1:1 mixture of acetone to deionized water.

The post-rinse lasts for about 5 minutes to about 60 minutes, about 10 minutes to about 50 minutes, about 15 minutes to about 45 minutes, about 20 minutes to about 40 minutes, or about 30 minutes. The workpiece 100 containing the aerospace component 110 can be sonicated while in the post-rinse. The post-rinse can be heated and/or maintained at a temperature of about 20° C., about 22° C., about 25° C., about 30° C. to about 35° C., about 40° C., about 50° C., about 80° C., or about 100° C. For example, the post-rinse can be heated and/or maintained at a temperature of about 20° C. to about 100° C., about 20° C. to about 50° C., or about 20° C. to about 30° C., such as at a room temperature of about 22° C. or about 23° C.

After the post-rinse, the workpiece 100 can optionally be dried at operation 240. In some examples, the aerospace component 110 can be air dried at ambient temperature and pressure in the air. In other examples, the workpiece 100 can be exposed to a flow of air, nitrogen ($N_2$), argon, or a mixture thereof from a blower, a fan, or the like at an ambient or heated temperature.

At operation 250, a protective coating 140 can be deposited or otherwise formed on the first and second portions of the aluminum oxide layer 130, as depicted in FIG. 1C. The first portion of the aluminum oxide layer 130 is within one or more voids or spaces 134 formed in the aluminum oxide layer 130. The protective coating 140 is deposited or otherwise formed conformally over and on the first and second portions of the aluminum oxide layer 130 including within the voids or spaces 134. In one or more embodiments, the protective coating 140 contains one or more of chromium oxide, aluminum oxide, aluminum nitride, hafnium oxide, titanium oxide, titanium nitride, tantalum oxide, tantalum nitride, dopants thereof, or any combination thereof. In other embodiments, the protective coating 140 can be or include any one or more of the protective coatings, the nanolaminate film stacks, materials, layers, or combinations thereof described and discussed herein. The protective coating 140 has a thickness of about 1 nm to about 10,000 nm, as further described and discussed below.

FIG. 2B is a flow chart illustrating a method 200B, which is an exemplary version of the method 200A with optional operations during the refurbishing process. In one or more examples, the workpiece 100 containing the aerospace component 110 having corrosion at Phase 1 can be treated by the method 200B, which includes: (1) exposing the workpiece 100 to a pre-rinse; optionally drying the workpiece 100; (2) exposing the workpiece 100 including the aluminum oxide layer 130 to an aqueous cleaning solution; optionally drying the workpiece 100; (3) exposing the workpiece 100 including the aluminum oxide layer 130 to a post-rinse; optionally drying the workpiece 100; and (4) forming a protective coating 140 over and on the first and second portions of the aluminum oxide layer 130.

In some examples, the method 200B can include: (1a) exposing the workpiece 100 to a pre-rinse containing a combination of deionized water and one or more organic solvents while sonicating at room temperature (e.g., about 23° C.) for about 30 minutes; (1b) drying the workpiece 100 with nitrogen gas from a nitrogen gun; (2a) exposing the workpiece 100 including the aluminum oxide layer 130 to an aqueous cleaning solution containing a combination of one or more chelating agents and one or more alkaline solutions while sonicating at room temperature (e.g., about 23° C.) for about 3 hours; (2b) drying the workpiece 100 with nitrogen gas from a nitrogen gun; (3a) exposing the workpiece 100 including the aluminum oxide layer 130 to a post-rinse containing a combination of deionized water and one or more organic solvents while sonicating at room temperature (e.g., about 23° C.) for about 60 minutes; (3b) drying the workpiece 100; (4) forming a protective coating 140 conformally over and on the first and second portions of the aluminum oxide layer 130.

FIGS. 3A-3D depict schematic views of a workpiece 300 containing an aerospace component 110 having corrosion at Phase 2 and being treated at different stages or operations of another refurbishing process. FIG. 4A is a flow chart illustrating a method 400A, a refurbishing process, which includes some of the different stages or operations of the refurbishing process performed on the workpiece 300 depicted in FIGS. 3A-3D.

The workpiece 300 has one or more aluminide layers 120 disposed on the nickel superalloy surface of the aerospace component 110 and one or more aluminum oxide layers 130 disposed on the aluminide layer 120, as depicted in FIG. 3A. Corrosion 132 is contained in an upper portion of the aluminum oxide layer 130 and in a lower portion of the aluminum oxide layer 130. In the lower portion of the aluminum oxide layer 130, some of the corrosion, depicted as corrosion 132a, is below the upper surface of the aluminum oxide layer 130, such that the corrosion 132a is not visible from a top view of the workpiece 300. The aluminide layer 120 and the superalloy of the aerospace component 110 are both substantially or completely free of the corrosion 132 at Phase 2 of the corrosion.

In some embodiments, prior to exposing the workpiece 300 containing the aerospace component 110 to the acidic cleaning solution to remove the corrosion at operation 410, the workpiece 300 can be exposed one or more processes and/or solutions. The workpiece 300 can be exposed to a pre-rinse, an aqueous cleaning solution, and one or more additional rinses.

The pre-rinse contains one or more organic solvents and water. Exemplary organic solvents can be or include acetone, methanol, ethanol, isopropanol, pentane, hexane, diethyl ether, or combinations thereof. The pre-rinse can include about 10 vol %, about 20 vol %, about 30 vol %, about 40 vol %, or about 50 vol % to about 60 vol %, about 70 vol %, about 80 vol %, about 90 vol %, or about 100 vol % of the solvent and the remainder is water. In one or more examples, the pre-rinse contains a 1:1 mixture of acetone to deionized water.

The pre-rinse lasts for about 5 minutes to about 60 minutes, about 10 minutes to about 50 minutes, about 15 minutes to about 45 minutes, about 20 minutes to about 40 minutes, or about 30 minutes. The workpiece 300 can be sonicated while in the pre-rinse. The pre-rinse can be heated and/or maintained at a temperature of about 20° C., about 22° C., about 25° C., about 30° C. to about 35° C., about 40° C., about 50° C., about 80° C., or about 100° C. For example, the pre-rinse can be heated and/or maintained at a temperature of about 20° C. to about 100° C., about 20° C. to about 50° C., or about 20° C. to about 30° C., such as at a room temperature of about 22° C. or about 23° C. After the pre-rinse, the workpiece 300 can optionally be dried, such as air dried at ambient temperature and pressure in the air or exposed to a flow of air, nitrogen ($N_2$), argon, or a mixture thereof from a blower, a fan, or the like at an ambient or heated temperature.

In one or more embodiments, prior to operation 410, the workpiece 300 containing the aerospace component 110 can be exposed to the aqueous cleaning solution. The solutions and process conditions described for the aqueous cleaning solution in operations 210 and 220 can be used with the workpiece 300 prior to operation 410.

As depicted in FIG. 3A, the corrosion 132 (e.g., Phase 2 corrosion 132) is contained on the first portion of the aluminum oxide layer 130 while the second portion of the aluminum oxide layer 130 also contains the corrosion 132a below the upper surface of the aluminum oxide layer 130.

The aqueous cleaning solution removes the corrosion 132 from the first portion of the aluminum oxide layer 130 to reveal the first portion of the aluminum oxide layer 130, but fails to remove the corrosion 132a from below the upper surface of the aluminum oxide layer 130, as depicted in FIG. 3B. The first portion of the aluminum oxide layer 130 is typically within one or more voids or spaces 134 formed in the aluminum oxide layer 130 below the upper surface of the aluminum oxide layer 130.

The aqueous cleaning solution contains water, one or more chelators or complexing agents, and one or more bases (e.g., hydroxide). Exemplary chelators or complexing agents can be or include oxalic acid, citric acid, bipyridine, o-phenylenediamine, ethylenediamine (EDA), nitrilotriacetic acid (NTA), Iminodiacetic acid, picolinic acid, (1,1,1)-trifluoroacetylacetone, 1,4,7-triazacyclononane (TACN), (N,N,N',N'-tetrakis(2-pyridinylmethyl)-1,2-ethanediamine (TPEN), ethylenediaminetetraacetic acid (EDTA), ethylenediaminediacetic acid (EDDA), ethylenediamine-N,N'-disuccinic acid (EDDS), ethylenediamine-N,N'-bis(2-hydroxyphenylacetic acid) (EDDHA), 1,4,7,10-tetraazacyclododecane-1,4,7,10-tetraacetic acid (DOTA, 1,2-bis(o-aminophenoxy)ethane-N,N,N',N'-tetraacetic acid) (BAPTA), aminoethylethanolamine (AEEA), thenoyltrifluoroacetone, salts thereof, adducts thereof, complexes thereof, or any combination thereof. Bases are used to increase the pH of the aqueous cleaning solution and can be or include inorganic bases and/or organic bases. In some examples, one or more hydroxides are used as the base. Exemplary hydroxides can be or include sodium hydroxide, potassium hydroxide, lithium hydroxide, cesium hydroxide, ammonium hydroxide, or any combination thereof. In one or more examples, the complexing agent can be or include ethylenediaminetetraacetic acid (EDTA) and/or a salt thereof and the base can be or include one or more hydroxides.

In one or more examples, workpiece 300 containing the aerospace component 110 is exposed to the aqueous cleaning solution for about 0.5 hours, about 0.8 hours, about 1 hour, or about 1.5 hours to about 2 hours, about 2.5 hours, about 3 hours, about 4 hours, about 5 hours, or longer. For example, workpiece 300 is exposed to the aqueous cleaning solution for about 0.5 hours to about 5 hours, about 1 hour to about 5 hours, about 2 hours to about 5 hours, about 2.5 hours to about 5 hours, about 3 hours to about 5 hours, about 4 hours to about 5 hours, about 0.5 hours to about 4 hours, about 1 hour to about 4 hours, about 2 hours to about 4 hours, about 2.5 hours to about 4 hours, about 3 hours to about 4 hours, about 0.5 hours to about 3 hours, about 1 hour to about 3 hours, about 2 hours to about 3 hours, or about 2.5 hours to about 3 hours. The workpiece 300 can be sonicated while in the aqueous cleaning solution.

The aqueous cleaning solution can be heated and/or maintained at a temperature of about 20° C., about 22° C., about 25° C., about 30° C. to about 35° C., about 40° C., about 50° C., about 80° C., or about 100° C. For example, the aqueous cleaning solution can be heated and/or maintained at a temperature of about 20° C. to about 100° C., about 20° C. to about 50° C., or about 20° C. to about 30° C., such as at a room temperature of about 22° C. or about 23° C. After operation 420 and before operation 430, the workpiece 300 can optionally be dried, such as air dried at ambient temperature and pressure in the air or exposed to a flow of air, nitrogen ($N_2$), argon, or a mixture thereof from a blower, a fan, or the like at an ambient or heated temperature.

In some examples, after the exposure of the aqueous cleaning solution, the workpiece 300 can be exposed to the rinse, such as with deionized water, one or more organic solvents, or a combination thereof. The workpiece 300 can be exposed to the rinse for about 5 minutes to about 60 minutes, about 10 minutes to about 50 minutes, about 15 minutes to about 45 minutes, about 20 minutes to about 40 minutes, or about 30 minutes. The workpiece 300 can optionally be sonicated while being rinsed. After the rinse, the workpiece 300 can optionally be dried, such as air dried at ambient temperature and pressure in the air or exposed to a flow of air, nitrogen ($N_2$), argon, or a mixture thereof from a blower, a fan, or the like at an ambient or heated temperature.

In one or more examples, prior to exposing the workpiece 300 to the acidic cleaning solution, the workpiece 300 is exposed to a pre-rinse for about 5 minutes to about 60 minutes, and the workpiece 300 is sonicated in the pre-rinse, which contains one or more organic solvents and water and is maintained at a temperature of about 20° C. to about 50° C. In other examples, prior to exposing the workpiece 300 to the acidic cleaning solution, the workpiece 300 is exposed to an aqueous cleaning solution for about 1 hour to about 5 hours, the aerospace component 110 is sonicated in the aqueous cleaning solution, which contains water, one or more complexing agents, and one or more bases and is maintained at a temperature of about 20° C. to about 50° C.

In one or more embodiments, the method 400A of refurbishing an aerospace component 110 includes exposing the workpiece 300 containing corrosion 132 and/or 132a to an acidic cleaning solution at operation 410. At operation 420, the aluminum oxide layer 130 and any corrosion 132 and/or 132a are removed from the workpiece 300 by the acidic cleaning solution to reveal on the aluminide layer 120, as depicted in FIG. 3C.

The acidic cleaning solution contains one or more acids, such as sulfuric acid, sulfurous acid, nitric acid, nitrous acid, hydrochloric acid (e.g., hydrogen chloride), perchloric acid, hydrofluoric acid (e.g., hydrogen fluoride), phosphoric acid, citric acid, acetic acid, methanoic acid (formic acid), salts thereof, adducts thereof, complexes thereof, or any combination thereof. The acidic cleaning solution contains water and about 5 volume percent (vol %), about 8 vol %, about 10 vol %, about 12 vol %, about 15 vol %, about 18 vol %, or about 20 vol % to about 22 vol %, about 25 vol %, about 30 vol %, about 35 vol %, about 40 vol %, or about 50 vol % of one or more acids. For example, the acidic cleaning solution contains about 5 vol % to about 50 vol %, about 5 vol % to about 40 vol %, about 10 vol % to about 40 vol %, about 15 vol % to about 40 vol %, about 20 vol % to about 40 vol %, about 25 vol % to about 40 vol %, about 30 vol % to about 40 vol %, about 5 vol % to about 30 vol %, about 10 vol % to about 30 vol %, about 15 vol % to about 30 vol %, about 20 vol % to about 30 vol %, about 25 vol % to about 30 vol %, about 28 vol % to about 30 vol %, about 5 vol % to about 20 vol %, about 10 vol % to about 20 vol %, about 15 vol % to about 20 vol %, about 18 vol % to about 20 vol %. In one or more examples, the acidic cleaning solution contains water and about 10 vol % to about 40 vol % of sulfuric acid.

At operations 410 and 420, workpiece 300 containing the aerospace component 110 is exposed to the acidic cleaning solution for about 10 minutes, about 20 minutes, about 30 minutes, about 40 minutes, about 45 minutes, or about 60 minutes to about 70 minutes, about 75 minutes, about 80 minutes, about 90 minutes, about 2 hours, about 2.5 hours, about 3 hours, or about 4 hours. For example, workpiece 300 is exposed to the acidic cleaning solution for about 10 minutes to about 4 hours, about 10 minutes to about 3 hours, about 10 minutes to about 2 hours, about 10 minutes to about 90 minutes, about 10 minutes to about 60 minutes, about 10 minutes to about 45 minutes, about 10 minutes to about 30 minutes, about 10 minutes to about 20 minutes, about 30 minutes to about 4 hours, about 30 minutes to about 3 hours, about 30 minutes to about 2 hours, about 30 minutes to about 90 minutes, about 30 minutes to about 60 minutes, about 30 minutes to about 45 minutes, about 45 minutes to about 4 hours, about 45 minutes to about 3 hours, about 45 minutes to about 2 hours, about 45 minutes to about 90 minutes, or about 45 minutes to about 60 minutes. The workpiece 300 can be mechanically stirred or sonicated while being exposed to the acidic cleaning solution.

The acidic cleaning solution can be heated and/or maintained at a temperature of about 20° C., about 22° C., about 25° C., about 35° C., about 50° C., or about 70° C. to about 80° C., about 90° C., about 100° C., about 120° C., about 150° C., or about 200° C. during operations 410 and 420. For example, the acidic cleaning solution can be heated and/or maintained at a temperature of about 20° C. to about 200° C., about 50° C. to about 150° C., about 70° C. to about 100° C., about 80° C. to about 90° C., about 70° C. to about 75° C., or about 80° C. to about 85° C. during operations 410 and 420. In one or more examples, the aerospace component 110 is exposed to the acidic cleaning solution for about 30 minutes to about 90 minutes or about 45 minutes to about 75 minutes while the acidic cleaning solution is being stirred and maintained at a temperature of about 50° C. to about 150° C., about 70° C. to about 100° C., or about 80° C. to about 85° C.

After operation 420 and before operation 430, the workpiece 300 can optionally be dried, such as air dried at ambient temperature and pressure in the air or exposed to a flow of air, nitrogen ($N_2$), argon, or a mixture thereof from a blower, a fan, or the like at an ambient or heated temperature.

In some examples, after the exposure of the acidic cleaning solution, the workpiece 300 can be exposed to the rinse, such as with deionized water, one or more organic solvents, or a combination thereof. The workpiece 300 can be exposed to the rinse for about 5 minutes to about 60 minutes, about 10 minutes to about 50 minutes, about 15 minutes to about 45 minutes, about 20 minutes to about 40 minutes, or about 30 minutes. The workpiece 300 can optionally be sonicated while being rinsed. After the rinse, the workpiece 300 can optionally be dried, such as air dried at ambient temperature and pressure in the air or exposed to a flow of air, nitrogen ($N_2$), argon, or a mixture thereof from a blower, a fan, or the like at an ambient or heated temperature.

Subsequently, the workpiece 300 containing the aerospace component 110 can be exposed to an aqueous cleaning solution and a drying process as described and discussed herein. In one or more examples, subsequent to exposing the workpiece 300 to the acidic cleaning solution, the workpiece 300 is exposed to a pre-rinse for about 5 minutes to about 60 minutes, and the workpiece 300 is sonicated in the pre-rinse, which contains one or more organic solvents and water and is maintained at a temperature of about 20° C. to about 50° C. In other examples, subsequent to exposing the workpiece 300 to the acidic cleaning solution, the workpiece 300 is exposed to an aqueous cleaning solution for about 1 hour to about 5 hours, and the aerospace component 110 is sonicated in the aqueous cleaning solution, which contains water, one or more complexing agents, and one or more bases and is maintained at a temperature of about 20° C. to about 50° C.

At operation 430, the workpiece 300 can be exposed to a post-rinse which contains one or more organic solvents and water. Exemplary organic solvents can be or include acetone, methanol, ethanol, isopropanol, pentane, hexane, diethyl ether, or combinations thereof. The post-rinse can include about 10 vol %, about 20 vol %, about 30 vol %, about 40 vol %, or about 50 vol % to about 60 vol %, about 70 vol %, about 80 vol %, about 90 vol %, or about 100 vol % of the solvent and the remainder is water. In one or more examples, the post-rinse contains a 1:1 mixture of acetone to deionized water.

The post-rinse lasts for about 5 minutes to about 3 hours, about 20 minutes to about 2 hours, about 30 minutes to about 90 minutes, about 45 minutes to about 75 minutes, such as about 60 minutes. The workpiece 300 can be sonicated while in the post-rinse. The post-rinse can be heated and/or maintained at a temperature of about 20° C., about 22° C., about 25° C., about 30° C. to about 35° C., about 40° C., about 50° C., about 80° C., or about 100° C. For example, the post-rinse can be heated and/or maintained at a temperature of about 20° C. to about 100° C., about 20° C. to about 50° C., or about 20° C. to about 30° C., such as at a room temperature of about 22° C. or about 23° C.

At operation 430, the workpiece 300 can optionally be dried, such as air dried at ambient temperature and pressure in the air or exposed to a flow of air, nitrogen ($N_2$), argon, or a mixture thereof from a blower, a fan, or the like at an ambient or heated temperature.

In one or more examples, the aluminide layer 120 is exposed to the post-rinse for about 10 minutes to about 90 minutes, and the workpiece 300 is sonicated in the post-rinse, which contains one or more organic solvents and water and is maintained at a temperature of about 20° C. to about 50° C.

At operation 450, a protective coating 140 can be deposited or otherwise formed on the workpiece 300, such as on the aluminide layer 120, as depicted in FIG. 3D. The protective coating 140 is deposited or otherwise formed conformally over and on the aluminide layer 120. In one or more embodiments, the protective coating 140 contains one or more of chromium oxide, aluminum oxide, aluminum nitride, hafnium oxide, titanium oxide, titanium nitride, tantalum oxide, tantalum nitride, dopants thereof, or any combination thereof. In other embodiments, the protective coating 140 can be or include any one or more of the protective coatings, the nanolaminate film stacks, materials, layers, or combinations thereof described and discussed herein. The protective coating 140 has a thickness of about 1 nm to about 10,000 nm, as further described and discussed below.

FIG. 4B is a flow chart illustrating a method 400B, which is an exemplary version of the method 400A with optional operations during the refurbishing process. In one or more examples, the workpiece 300 containing the aerospace component 110 having corrosion at Phase 2 can be treated by the method 400B, which includes: (1) exposing the workpiece 300 to a pre-rinse; optionally drying the workpiece 300; (2) optionally exposing the workpiece 300 including the aluminum oxide layer 130 to an aqueous cleaning solution; optionally drying the workpiece 300; (3) optionally exposing the workpiece 300 including the aluminum oxide layer 130 to another rinse (e.g., water or mixture of water and organic solvent similar to pre-rinse or post rinse); optionally drying the workpiece 300; (4) exposing the workpiece 300 including the aluminum oxide layer 130 to an acidic cleaning solution containing sulfuric acid; optionally drying the workpiece 300; (5) optionally exposing the workpiece 300 including the aluminum oxide layer 130 to another rinse (e.g., water or mixture of water and organic solvent similar to pre-rinse or post rinse); optionally drying the workpiece 300; (6) optionally exposing the workpiece 300 to an aqueous cleaning solution; optionally drying the workpiece 300; (7) exposing the workpiece 300 including the aluminum oxide layer 130 to a post-rinse; optionally drying the workpiece 300; and (8) forming the protective coating 140 over and on at least a portion (e.g., second portion) of the aluminide layer 120.

In some examples, the method 400B can include: (1a) exposing the workpiece 300 to a pre-rinse containing a combination of deionized water and one or more organic solvents while sonicating at room temperature (e.g., about 23° C.) for about 30 minutes; (1b) drying the workpiece 300 with nitrogen gas from a nitrogen gun; (2a) optionally exposing the workpiece 300 including the aluminum oxide layer 130 to an aqueous cleaning solution containing a combination of one or more chelating agents and one or more alkaline solutions while sonicating at room temperature (e.g., about 23° C.) for about 3 hours; (2b) drying the workpiece 300 with nitrogen gas from a nitrogen gun; (3a) exposing the workpiece 300 including the aluminum oxide layer 130 to a rinse containing deionized water while sonicating for about 1 hour; (3b) drying the workpiece 300 with nitrogen gas from a nitrogen gun; (4a) exposing the workpiece 300 including the aluminum oxide layer 130 to an acidic cleaning solution containing sulfuric acid (about 10 v/v % to about 40 v/v %) while mechanically stirring at a temperature of about 50° C. to about 100° C. for about 1 hour; (4b) drying the workpiece 300 with nitrogen gas from a nitrogen gun; (5a) exposing the workpiece 300 including the aluminum oxide layer 130 to a rinse containing deionized water while sonicating for about 1 hour; (5b) drying the workpiece 300 with nitrogen gas from a nitrogen gun; (6a) exposing the workpiece 300 to an aqueous cleaning solution containing a combination of one or more chelating agents and one or more alkaline solutions while sonicating at room temperature (e.g., about 23° C.) for about 3 hours; drying the workpiece 300 with nitrogen gas from a nitrogen gun; (7a) exposing the workpiece 300 including the aluminum oxide layer 130 to a post-rinse containing a combination of deionized water and one or more organic solvents while sonicating at room temperature (e.g., about 23° C.) for about 60 minutes; (7b) drying the workpiece 300 with nitrogen gas from a nitrogen gun; and (8) forming the protective coating 140 over and on a second portion of the aluminide layer 120.

FIGS. 5A-5D depict schematic views of a workpiece 500 containing an aerospace component 110 having corrosion at Phase 3 and being treated at different stages or operations of another refurbishing process. FIG. 6A is a flow chart illustrating a method 600A, a refurbishing process, which includes some of the different stages or operations of the refurbishing process performed on the workpiece 500 depicted in FIGS. 5A-5D.

The method 600A of refurbishing an aerospace component 110 includes exposing the workpiece 500 containing the aerospace component 110 having corrosion 132 to an acidic cleaning solution at operation 610. The aerospace component 110 contains a nickel superalloy, an aluminide layer 120 disposed on the nickel superalloy, and an aluminum oxide layer 130 disposed on the aluminide layer 120. The corrosion 132 (e.g., Phase 3 corrosion 132) is contained on the aluminum oxide layer 130 and within the aluminum oxide layer 130, as depicted in FIG. 5A. In the lower portion of the aluminum oxide layer 130, some of the corrosion, depicted as corrosion 132b, is below the upper surface of the aluminum oxide layer 130 and can extend into the first or upper portion of the aluminide layer 120, such that the corrosion 132b is not visible from a top view of the workpiece 500. Some of the corrosion, depicted as corrosion 132c, extends from the upper surface of the aluminum oxide layer 130, completely through the aluminum oxide layer 130, and into a first or upper portion of the aluminide layer 120. The superalloy of the aerospace component 110 is substantially or completely free of the corrosion 132 at Phase 3 of the corrosion.

The method 600A includes removing the corrosion 132, the aluminum oxide layer 130, and the first portion of the aluminide layer 120 with the acidic cleaning solution to reveal a second portion of the aluminide layer 120 at operation 620, then exposing the workpiece 500 to a post-rinse at operation 630, exposing the workpiece 500 to a drying process at operation 640, and forming a protective coating 140 on the second portion of the aluminide layer 120 at operation 650.

In some embodiments, prior to exposing the workpiece 500 containing the aerospace component 110 to the acidic cleaning solution to remove the corrosion at operation 610, the workpiece 500 can be exposed one or more processes and/or solutions. The workpiece 500 can be exposed to a pre-rinse, an aqueous cleaning solution, and one or more additional rinses.

The pre-rinse contains one or more organic solvents and water. Exemplary organic solvents can be or include acetone, methanol, ethanol, isopropanol, pentane, hexane, diethyl ether, or combinations thereof. The pre-rinse can include about 10 vol %, about 20 vol %, about 30 vol %, about 40 vol %, or about 50 vol % to about 60 vol %, about 70 vol %, about 80 vol %, about 90 vol %, or about 100 vol % of the solvent and the remainder is water. In one or more examples, the pre-rinse contains a 1:1 mixture of acetone to deionized water.

The pre-rinse lasts for about 5 minutes to about 60 minutes, about 10 minutes to about 50 minutes, about 15 minutes to about 45 minutes, about 20 minutes to about 40 minutes, or about 30 minutes. The workpiece 500 can be sonicated while in the pre-rinse. The pre-rinse can be heated and/or maintained at a temperature of about 20° C., about 22° C., about 25° C., about 30° C. to about 35° C., about 40° C., about 50° C., about 80° C., or about 100° C. For example, the pre-rinse can be heated and/or maintained at a temperature of about 20° C. to about 100° C., about 20° C. to about 50° C., or about 20° C. to about 30° C., such as at a room temperature of about 22° C. or about 23° C. After the pre-rinse, the workpiece 500 can optionally be dried, such as air dried at ambient temperature and pressure in the air or exposed to a flow of air, nitrogen ($N_2$), argon, or a mixture thereof from a blower, a fan, or the like at an ambient or heated temperature.

In one or more embodiments, prior to operation 610, the workpiece 500 containing the aerospace component 110 can be exposed to the aqueous cleaning solution. The solutions and process conditions described for the aqueous cleaning solution in operations 210 and 220 can be used with the workpiece 500 prior to operation 610.

As depicted in FIG. 5A, the corrosion 132 (e.g., Phase 3 corrosion 132) is contained on the first portion of the aluminum oxide layer 130 while the second portion of the aluminum oxide layer 130 also contains the corrosion 132b below the upper surface of the aluminum oxide layer 130 and extending into the aluminide layer 120. The workpiece also has corrosion 132c extending from the upper surface of the aluminum oxide layer 130, completely through the aluminum oxide layer 130, and into a first or upper portion of the aluminide layer 120. Although not depicted in the FIG. 5A, the corrosion can be below the upper surface of the aluminum oxide layer 130, so not to be visible from above the workpiece, but does not extend into the aluminide layer 120 (e.g., similar to the corrosion 132a depicted in FIG. 3A). The superalloy of the aerospace component 110 is substantially or completely free of the corrosion 132 at Phase 3 of the corrosion.

The aqueous cleaning solution removes the corrosion 132 from the first portion of the aluminum oxide layer 130 to reveal the first portion of the aluminum oxide layer 130 and removes the corrosion 132c from the aluminum oxide layer 130 and the first or upper portion of the aluminide layer 120 to reveal portions of the aluminum oxide layer 130 and the aluminide layer 120, as depicted in FIG. 5B. The aqueous cleaning solution fails to remove the corrosion 132b from below the upper surface of the aluminum oxide layer 130. The first portion of the aluminum oxide layer 130 is typically within one or more voids or spaces 134, 134a formed in the aluminum oxide layer 130 below the upper surface of the aluminum oxide layer 130.

The aqueous cleaning solution contains water, one or more chelators or complexing agents, and one or more bases (e.g., hydroxide). Exemplary chelators or complexing agents can be or include oxalic acid, citric acid, bipyridine, o-phenylenediamine, ethylenediamine (EDA), nitrilotriacetic acid (NTA), Iminodiacetic acid, picolinic acid, (1,1,1)-trifluoroacetylacetone, 1,4,7-triazacyclononane (TACN), (N,N,N',N'-tetrakis(2-pyridinylmethyl)-1,2-ethanediamine (TPEN), ethylenediaminetetraacetic acid (EDTA), ethylenediaminediacetic acid (EDDA), ethylenediamine-N,N'-disuccinic acid (EDDS), ethylenediamine-N,N'-bis(2-hydroxyphenylacetic acid) (EDDHA), 1,4,7,10-tetraazacyclododecane-1,4,7,10-tetraacetic acid (DOTA, 1,2-bis(o-aminophenoxy)ethane-N,N,N',N'-tetraacetic acid) (BAPTA), aminoethylethanolamine (AEEA), thenoyltrifluoroacetone, salts thereof, adducts thereof, complexes thereof, or any combination thereof. Bases are used to increase the pH of the aqueous cleaning solution and can be or include inorganic bases and/or organic bases. In some examples, one or more hydroxides are used as the base. Exemplary hydroxides can be or include sodium hydroxide, potassium hydroxide, lithium hydroxide, cesium hydroxide, ammonium hydroxide, or any combination thereof. In one or more examples, the complexing agent can be or include ethylenediaminetetraacetic acid (EDTA) and/or a salt thereof and the base can be or include one or more hydroxides.

In one or more examples, workpiece 500 containing the aerospace component 110 is exposed to the aqueous cleaning solution for about 0.5 hours, about 0.8 hours, about 1 hour, or about 1.5 hours to about 2 hours, about 2.5 hours, about 3 hours, about 4 hours, about 5 hours, or longer. For example, workpiece 500 is exposed to the aqueous cleaning solution for about 0.5 hours to about 5 hours, about 1 hour to about 5 hours, about 2 hours to about 5 hours, about 2.5 hours to about 5 hours, about 3 hours to about 5 hours, about 4 hours to about 5 hours, about 0.5 hours to about 4 hours, about 1 hour to about 4 hours, about 2 hours to about 4 hours, about 2.5 hours to about 4 hours, about 3 hours to about 4 hours, about 0.5 hours to about 3 hours, about 1 hour to about 3 hours, about 2 hours to about 3 hours, or about 2.5 hours to about 3 hours. The workpiece 500 can be sonicated while in the aqueous cleaning solution.

The aqueous cleaning solution can be heated and/or maintained at a temperature of about 20° C., about 22° C., about 25° C., about 30° C. to about 35° C., about 40° C., about 50° C., about 80° C., or about 100° C. For example, the aqueous cleaning solution can be heated and/or maintained at a temperature of about 20° C. to about 100° C., about 20° C. to about 50° C., or about 20° C. to about 30° C., such as at a room temperature of about 22° C. or about 23° C. After operation 620 and before operation 630, the workpiece 500 can optionally be dried, such as air dried at ambient temperature and pressure in the air or exposed to a flow of air, nitrogen ($N_2$), argon, or a mixture thereof from a blower, a fan, or the like at an ambient or heated temperature.

In some examples, after the exposure of the aqueous cleaning solution, the workpiece 500 can be exposed to the rinse, such as with deionized water, one or more organic solvents, or a combination thereof. The workpiece 500 can be exposed to the rinse for about 5 minutes to about 60 minutes, about 10 minutes to about 50 minutes, about 15 minutes to about 45 minutes, about 20 minutes to about 40 minutes, or about 30 minutes. The workpiece 500 can optionally be sonicated while being rinsed. After the rinse, the workpiece 500 can optionally be dried, such as air dried at ambient temperature and pressure in the air or exposed to a flow of air, nitrogen ($N_2$), argon, or a mixture thereof from a blower, a fan, or the like at an ambient or heated temperature.

In one or more examples, prior to exposing the workpiece 500 to the acidic cleaning solution, the workpiece 500 is exposed to a pre-rinse for about 5 minutes to about 60 minutes, and the workpiece 500 is sonicated in the pre-rinse, which contains one or more organic solvents and water and is maintained at a temperature of about 20° C. to about 50° C. In other examples, prior to exposing the workpiece 500 to the acidic cleaning solution, the workpiece 500 is exposed to an aqueous cleaning solution for about 1 hour to about 5 hours, and the aerospace component 110 is sonicated in the aqueous cleaning solution, which contains water, one or more complexing agents, and one or more bases and is maintained at a temperature of about 20° C. to about 50° C.

In one or more embodiments, the method 600A of refurbishing an aerospace component 110 includes exposing the workpiece 500 containing corrosion 132 and/or 132a to an acidic cleaning solution at operation 610. At operation 620, the aluminum oxide layer 130, a first or upper portion of the aluminide layer 120, and any corrosion, including corrosion 132, 132b, and/or 132c, are removed from the workpiece 500 by the acidic cleaning solution to reveal a second or lower portion of the aluminide layer 120, as depicted in FIG. 5C.

The acidic cleaning solution contains one or more acids, such as hydrofluoric acid (e.g., hydrogen fluoride), nitric acid, phosphoric acid, hydrochloric acid (e.g., hydrogen chloride), perchloric acid, sulfuric acid, methanesulfonic acid, acetic acid, lactic acid, salts thereof, adducts thereof, complexes thereof, or any combination thereof. The acidic cleaning solution contains water and about 0.1 vol %, about 0.2 vol %, about 0.5 vol %, about 0.8 vol %, about 1 vol %, about 1.5 vol %, about 2 vol %, about 3 vol %, about 4 vol %, about 5 vol %, about 8 vol %, about 10 vol %, about 12 vol %, about 15 vol %, about 18 vol %, or about 20 vol % to about 22 vol %, about 25 vol %, about 30 vol %, about 35 vol %, about 40 vol %, or about 50 vol % of one or more acids. For example, the acidic cleaning solution contains about 0.1 vol % to about 50 vol %, about 0.5 vol % to about 50 vol %, about 1 vol % to about 50 vol %, about 2 vol % to about 50 vol %, about 3 vol % to about 50 vol %, about 5 vol % to about 50 vol %, about 5 vol % to about 40 vol %, about 10 vol % to about 40 vol %, about 15 vol % to about 40 vol %, about 20 vol % to about 40 vol %, about 25 vol % to about 40 vol %, about 30 vol % to about 40 vol %, about 0.1 vol % to about 30 vol %, about 0.5 vol % to about 30 vol %, about 1 vol % to about 30 vol %, about 2 vol % to about 30 vol %, about 3 vol % to about 30 vol %, about 5 vol % to about 30 vol %, about 10 vol % to about 30 vol %, about 15 vol % to about 30 vol %, about 20 vol % to about 30 vol %, about 25 vol % to about 30 vol %, about 28 vol % to about 30 vol %, about 0.1 vol % to about 20 vol %, about 0.5 vol % to about 20 vol %, about 1 vol % to about 20 vol %, about 2 vol % to about 20 vol %, about 3 vol % to about 20 vol %, about 5 vol % to about 20 vol %, about 10 vol % to about 20 vol %, about 15 vol % to about 20 vol %, about 18 vol % to about 20 vol %, about 0.1 vol % to about 10 vol %, about 0.5 vol % to about 10 vol %, about 1 vol % to about 10 vol %, about 2 vol % to about 10 vol %, about 3 vol % to about 10 vol %, about 5 vol % to about 10 vol %, about 6 vol % to about 10 vol %, about 8 vol % to about 10 vol %, about 0.1 vol % to about 5 vol %, about 0.5 vol % to about 5 vol %, about 1 vol % to about 5 vol %, about 2 vol % to about 5 vol %, about 3 vol % to about 5 vol %, or about 4 vol % to about 5 vol %.

In one or more examples, the acidic cleaning solution contains water, hydrogen fluoride, and nitric acid. In some examples, the acidic cleaning solution contains about 0.2 vol % to about 5 vol % of hydrogen fluoride, about 1 vol % to about 10 vol % of nitric acid, and the remainder water. In other examples, the acidic cleaning solution contains about 0.5 vol % to about 3 vol % of hydrogen fluoride, about 2 vol % to about 8 vol % of nitric acid, and the remainder water. In further examples, the acidic cleaning solution contains about 0.8 vol % to about 1.2 vol % of hydrogen fluoride, about 3.5 vol % to about 7 vol % of nitric acid, and the remainder water.

At operations 610 and 620, workpiece 500 containing the aerospace component 110 is exposed to the acidic cleaning solution for about 10 minutes, about 20 minutes, about 30 minutes, about 40 minutes, about 45 minutes, or about 60 minutes to about 70 minutes, about 75 minutes, about 80 minutes, about 90 minutes, about 2 hours, about 2.5 hours, about 3 hours, or about 4 hours. For example, workpiece 500 is exposed to the acidic cleaning solution for about 10 minutes to about 4 hours, about 10 minutes to about 3 hours, about 10 minutes to about 2 hours, about 10 minutes to about 90 minutes, about 10 minutes to about 60 minutes, about 10 minutes to about 45 minutes, about 10 minutes to about 30 minutes, about 10 minutes to about 20 minutes, about 30 minutes to about 4 hours, about 30 minutes to about 3 hours, about 30 minutes to about 2 hours, about 30 minutes to about 90 minutes, about 30 minutes to about 60 minutes, about 30 minutes to about 45 minutes, about 45 minutes to about 4 hours, about 45 minutes to about 3 hours, about 45 minutes to about 2 hours, about 45 minutes to about 90 minutes, or about 45 minutes to about 60 minutes. The workpiece 500 can be mechanically stirred or sonicated while being exposed to the acidic cleaning solution.

The acidic cleaning solution can be heated and/or maintained at a temperature of about 20° C., about 22° C., about 25° C., about 35° C., about 50° C., or about 70° C. to about 80° C., about 90° C., about 100° C., about 120° C., about 150° C., or about 200° C. during operations 610 and 620. For example, the acidic cleaning solution can be heated and/or maintained at a temperature of about 20° C. to about 200° C., about 20° C. to about 100° C., about 20° C. to about 80° C., about 20° C. to about 50° C., about 20° C. to about 40° C., about 20° C. to about 35° C., about 20° C. to about 30° C., about 20° C. to about 25° C., or about 20° C. to about 22° C. during operations 610 and 620. In one or more examples, the aerospace component 110 is exposed to the acidic cleaning solution for about 30 minutes to about 90 minutes or about 45 minutes to about 75 minutes while the acidic cleaning solution is being stirred and maintained at a temperature of about 20° C. to about 50° C., about 22° C. to about 35° C., or about 22° C. to about 25° C.

After operation 620 and before operation 630, the workpiece 500 can optionally be dried, such as air dried at ambient temperature and pressure in the air or exposed to a flow of air, nitrogen ($N_2$), argon, or a mixture thereof from a blower, a fan, or the like at an ambient or heated temperature.

In some examples, after the exposure of the acidic cleaning solution, the workpiece 500 can be exposed to the rinse, such as with deionized water, one or more organic solvents, or a combination thereof. The workpiece 500 can be exposed to the rinse for about 5 minutes to about 60 minutes, about 10 minutes to about 50 minutes, about 15 minutes to about 45 minutes, about 20 minutes to about 40 minutes, or about 30 minutes. The workpiece 500 can optionally be sonicated while being rinsed. After the rinse, the workpiece 500 can optionally be dried, such as air dried at ambient temperature and pressure in the air or exposed to a flow of air, nitrogen ($N_2$), argon, or a mixture thereof from a blower, a fan, or the like at an ambient or heated temperature.

Subsequently, the workpiece 500 containing the aerospace component 110 can be exposed to an aqueous cleaning solution and a drying process as described and discussed herein. In one or more examples, subsequent to exposing the workpiece 500 to the acidic cleaning solution, the workpiece 500 is exposed to a pre-rinse for about 5 minutes to about 60 minutes, and the workpiece 500 is sonicated in the pre-rinse, which contains one or more organic solvents and water and is maintained at a temperature of about 20° C. to about 50° C. In other examples, subsequent to exposing the workpiece 500 to the acidic cleaning solution, the workpiece 500 is exposed to an aqueous cleaning solution for about 1 hour to about 5 hours, and the aerospace component 110 is sonicated in the aqueous cleaning solution, which contains water, one or more complexing agents, and one or more bases and is maintained at a temperature of about 20° C. to about 50° C.

At operation 630, the workpiece 500 can be exposed to a post-rinse which contains one or more organic solvents and water. Exemplary organic solvents can be or include acetone, methanol, ethanol, isopropanol, pentane, hexane, diethyl ether, or combinations thereof. The post-rinse can include about 10 vol %, about 20 vol %, about 30 vol %, about 40 vol %, or about 50 vol % to about 60 vol %, about 70 vol %, about 80 vol %, about 90 vol %, or about 100 vol % of the solvent and the remainder is water. In one or more examples, the post-rinse contains a 1:1 mixture of acetone to deionized water.

The post-rinse lasts for about 5 minutes to about 3 hours, about 20 minutes to about 2 hours, about 30 minutes to about 90 minutes, about 45 minutes to about 75 minutes, such as about 60 minutes. The workpiece 500 can be sonicated while in the post-rinse. The post-rinse can be heated and/or maintained at a temperature of about 20° C., about 22° C., about 25° C., about 30° C. to about 35° C., about 40° C., about 50° C., about 80° C., or about 100° C. For example, the post-rinse can be heated and/or maintained at a temperature of about 20° C. to about 100° C., about 20° C. to about 50° C., or about 20° C. to about 30° C., such as at a room temperature of about 22° C. or about 23° C.

At operation 630, the workpiece 500 can optionally be dried, such as air dried at ambient temperature and pressure in the air or exposed to a flow of air, nitrogen ($N_2$), argon, or a mixture thereof from a blower, a fan, or the like at an ambient or heated temperature.

In one or more examples, the aluminide layer 120 is exposed to the post-rinse for about 10 minutes to about 90 minutes, the workpiece 500 is sonicated in the post-rinse, and the post-rinse contains one or more organic solvents and water and is maintained at a temperature of about 20° C. to about 50° C.

At operation 650, a protective coating 140 can be deposited or otherwise formed on the workpiece 500, such as on the aluminide layer 120, as depicted in FIG. 5D. The protective coating 140 is deposited or otherwise formed conformally over and on the aluminide layer 120. In one or more embodiments, the protective coating 140 contains one or more of chromium oxide, aluminum oxide, aluminum nitride, hafnium oxide, titanium oxide, titanium nitride, tantalum oxide, tantalum nitride, dopants thereof, or any combination thereof. In other embodiments, the protective coating 140 can be or include any one or more of the protective coatings, the nanolaminate film stacks, materials, layers, or combinations thereof described and discussed herein. The protective coating 140 has a thickness of about 1 nm to about 10,000 nm, as further described and discussed below.

FIG. 6B is a flow chart illustrating a method 600B, which is an exemplary version of the method 600A with optional operations during the refurbishing process. In one or more examples, the workpiece 500 containing the aerospace component 110 having corrosion at Phase 3 can be treated by the method 600B, which include: (1) exposing the workpiece 500 to a pre-rinse; optionally drying the workpiece 500; (2) optionally exposing the workpiece 500 including the aluminum oxide layer 130 to an aqueous cleaning solution; optionally drying the workpiece 500; (3) optionally exposing the workpiece 500 including the aluminum oxide layer 130 to another rinse (e.g., water or mixture of water and organic solvent similar to pre-rinse or post rinse); optionally drying the workpiece 500; (4) exposing the workpiece 500 including the aluminum oxide layer 130 to one or more acids, a mixture of acids, and/or an acidic cleaning solution containing a mixture of hydrofluoric acid and nitric acid (e.g., HF:HNO$_3$ mixture); optionally drying the workpiece 500; (5) optionally exposing the workpiece 500 including the aluminum oxide layer 130 to another rinse (e.g., water or mixture of water and organic solvent similar to pre-rinse or post rinse); optionally drying the workpiece 500; (6) optionally exposing the workpiece 500 to an aqueous cleaning solution; optionally drying the workpiece 500; (7) exposing the workpiece 500 including the aluminum oxide layer 130 to a post-rinse; optionally drying the workpiece 500; and (8) forming the protective coating 140 over and on at least a portion (e.g., second portion) of the aluminide layer 120.

In some examples, the method 600B can include: (1a) exposing the workpiece 500 to a pre-rinse containing a combination of deionized water and one or more organic solvents while sonicating at room temperature (e.g., about 23° C.) for about 30 minutes; (1b) drying the workpiece 500 with nitrogen gas from a nitrogen gun; (2a) optionally exposing the workpiece 500 including the aluminum oxide layer 130 to an aqueous cleaning solution containing a combination of one or more chelating agents and one or more alkaline solutions while sonicating at room temperature (e.g., about 23° C.) for about 3 hours; (2b) drying the workpiece 500 with nitrogen gas from a nitrogen gun; (3a) exposing the workpiece 500 including the aluminum oxide layer 130 to a rinse containing deionized water while sonicating for about 1 hour; (3b) drying the workpiece 500 with nitrogen gas from a nitrogen gun; (4a) exposing the workpiece 500 including the aluminum oxide layer 130 to an acidic cleaning solution (e.g., HF:HNO$_3$ mixture containing contains about 0.8 vol % to about 1.2 vol % of hydrogen fluoride, about 3.5 vol % to about 7 vol % of nitric acid, and the remainder water) while mechanically stirring at room temperature (e.g., about 23° C.) for about 1 hour; (4b) drying the workpiece 500 with nitrogen gas from a nitrogen gun; (5a) exposing the workpiece 500 including the aluminum oxide layer 130 to a rinse containing deionized water while sonicating for about 1 hour; (5b) drying the workpiece 500 with nitrogen gas from a nitrogen gun; (6a) exposing the workpiece 500 to an aqueous cleaning solution containing a combination of one or more chelating agents and one or more alkaline solutions while sonicating at room temperature (e.g., about 23° C.) for about 3 hours; drying the workpiece 500 with nitrogen gas from a nitrogen gun; (7a) exposing the workpiece 500 including the aluminum oxide layer 130 to a post-rinse containing a combination of deionized water and one or more organic solvents while sonicating at room temperature (e.g., about 23° C.) for about 60 minutes; (7b) drying the workpiece 500 with nitrogen gas from a nitrogen gun; and (8) forming the protective coating 140 over and on a second portion of the aluminide layer 120.

Alternative Clean Processes

Prior to depositing or otherwise forming the protective coating 140 at operations 250, 450, 650, the workpiece 100, 300, 500 can optionally be exposed to one or more cleaning processes. One or more contaminants are removed from the aerospace component to produce the cleaned surface during the cleaning process. The contaminant can be or include acids, bases, oxides, organics or organic residues, carbon, oil, soil, particulates, debris, and/or other contaminants, or any combination thereof. These contaminants are removed prior to producing the protective coating 140 on the workpiece 100, 300, 500.

The cleaning process can be or include one or more basting or texturing processes, vacuum purges, solvent clean, acid clean, basic or caustic clean, wet clean, ozone clean, plasma clean, sonication, or any combination thereof. Once cleaned and/or textured, the subsequently deposited protective coating has stronger adhesion to the cleaned surfaces or otherwise altered surfaces of the workpiece 100, 300, 500 than if otherwise not exposed to the cleaning process.

In one or more examples, the surfaces of the workpiece 100, 300, 500 can be blasted with or otherwise exposed to beads, sand, carbonate, or other particulates to remove oxides and other contaminates therefrom and/or to provide texturing to the surfaces of the aerospace component. In some examples, the workpiece 100, 300, 500 can be placed into a chamber within a pulsed push-pull system and exposed to cycles of purge gas or liquid (e.g., N$_2$, Ar, He, one or more alcohols (methanol, ethanol, propanol, and/or others), H$_2$O, or any combination thereof) and vacuum purges to remove debris from small holes on the workpiece 100, 300, 500. In other examples, the surfaces of the workpiece 100, 300, 500 can be exposed to hydrogen plasma, oxygen or ozone plasma, and/or nitrogen plasma, which can be generated in a plasma chamber or by a remote plasma system.

In some examples, such as for organic removal or oxide removal, the surfaces of the workpiece 100, 300, 500 can be exposed to a hydrogen plasma, then degassed, then exposed to ozone treatment. In other examples, such as for organic removal, the surfaces of the workpiece 100, 300, 500 can be exposed to a wet clean that includes: soaking in an alkaline degreasing solution, rinsing, exposing the surfaces to an acid clean (e.g., sulfuric acid, phosphoric acid, hydrochloric acid, hydrofluoric acid, or any combination thereof), rinsing, and exposing the surfaces to a deionized water sonication bath. In some examples, such as for oxide removal, the surfaces of the workpiece 100, 300, 500 can be exposed to a wet clean that includes: exposing the surfaces to a dilute acid solution (e.g., acetic acid hydrochloric acid, hydrofluoric acid, or combinations thereof), rinsing, and exposing the surfaces to a deionized water sonication bath. In one or more examples, such as for particle removal, the surfaces of the workpiece 100, 300, 500 can be exposed to sonication (e.g., megasonication) and/or a supercritical fluid (carbon dioxide, water, one or more alcohols) wash, followed by exposing to cycles of purge gas or liquid (e.g., air, $N_2$, Ar, He, one or more alcohols, water, or any combination thereof) and vacuum purges to remove particles from and dry the surfaces. In some examples, the workpiece 100, 300, 500 can be exposed to heating or drying processes, such as heating the workpiece 100, 300, 500 to a temperature of about 50° C., about 65° C., or about 80° C. to about 100° C., about 120° C., or about 150° C. and exposing to surfaces to the purge gas. The workpiece 100, 300, 500 can be heated in an oven or exposed to lamps for the heating or drying processes. Optionally, hot gas can be forced through internal passages to accelerate drying. Optionally, the component can be dried in reduced atmosphere without heating or with heating. In various embodiments, the cleaned surface of the workpiece 100, 300, 500 can be one or more interior surfaces and/or one or more exterior surfaces of the workpiece 100, 300, 500.

Vapor Deposition Process

In one or more embodiments, a method for depositing a protective coating on an aerospace component includes sequentially exposing the aerospace component to an aluminum precursor and one or more reactants to form an aluminum-containing layer on a surface of the aerospace component by an ALD process or a PE-ALD. In other embodiments, a method for depositing a protective coating on an aerospace component includes simultaneously exposing the aerospace component to an aluminum precursor and one or more reactants to form an aluminum-containing layer on a surface of the aerospace component by a CVD process or a PE-CVD. In some examples, the reactant can be or contain one or more oxidizing agents and/or one or more nitriding agents. The oxidizing agent can be or contain water, ozone, oxygen ($O_2$), atomic oxygen, nitrous oxide, one or more peroxides (e.g., hydrogen peroxide, other inorganic peroxides, organic peroxides), one or more alcohols (e.g., methanol, ethanol, propanol, or higher alcohols), plasmas thereof, or any combination thereof. The nitriding agent can be or contain ammonia, nitric oxide, atomic nitrogen, a hydrazine, plasmas thereof, or any combination thereof. The aluminum-containing layer contains aluminum oxide, aluminum nitride, aluminum oxynitride, or any combination thereof.

In other embodiments, a method for depositing a protective coating on an aerospace component includes sequentially exposing the aerospace component to a chromium precursor and a reactant to form a chromium-containing layer on a surface of the aerospace component by an ALD process. The chromium-containing layer contains metallic chromium, chromium oxide, chromium nitride, chromium carbide, chromium silicide, or any combination thereof.

In some embodiments, a nanolaminate film stack is formed on the surface of the aerospace component, where the nanolaminate film stack contains alternating layers of the chromium-containing layer and a second deposited layer. The aerospace component can be sequentially exposed to a metal or silicon precursor and a second reactant to form the second deposited layer on the surface by ALD. The second deposited layer contains aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof. The nanolaminate film stack containing the alternating layers of the chromium-containing layer and the second deposited layer can be used as the protective coating on the aerospace component. Alternatively, in other embodiments, the nanolaminate film stack disposed on the aerospace component can be exposed to an annealing process to convert the nanolaminate film stack into a coalesced film, which can be used as the protective coating on the aerospace component.

In one or more embodiments, the protective coating contains a nanolaminate film stack containing one pair or a plurality of pairs of a first deposited layer and a second deposited layer sequentially deposited or otherwise formed on the aerospace component. The nanolaminate film stack is illustrated with four pairs of the first and second deposited layers, however, the nanolaminate film stack can contain any number of the first and second deposited layers, as further discussed below. For example, the nanolaminate film stack can contain from one pair of the first and second deposited layers to about 150 pairs of the first and second deposited layers. In other embodiments, not shown, the protective coating is not a nanolaminate film stack, but instead contains the first deposited layer or the second deposited layer deposited or otherwise formed on the aerospace component. In further embodiments, the nanolaminate film stack containing one or more pairs of the first and second deposited layers are initially deposited, then is converted to a coalesced film or a crystalline film.

In other embodiments, the protective coating contains a nanolaminate film stack. The nanolaminate film stack contains a first deposited layer and a second deposited layer, and the method further includes depositing from 2 pairs to about 500 pairs of the first deposited layer and the second deposited layer while increasing a thickness of the nanolaminate film stack. In one or more examples, each pair of the first deposited layer and the second deposited layer can have a thickness of about 0.2 nm to about 500 nm. In some examples, the method further includes annealing the aerospace component and converting the nanolaminate film stack into a coalesced film or a crystalline film.

The aerospace component can be exposed to a first precursor and a first reactant to form the first deposited layer on the aerospace component by a vapor deposition process. The vapor deposition process can be an ALD process, a plasma-enhanced ALD (PE-ALD) process, a thermal chemical vapor deposition (CVD) process, a plasma-enhanced CVD (PE-CVD) process, a pulsed-CVD process, or any combination thereof.

In one or more embodiments, the vapor deposition process is an ALD process and the method includes sequentially exposing the surface of the aerospace component to the first precursor and the first reactant to form the first deposited layer. Each cycle of the ALD process includes exposing the surface of the aerospace component to the first precursor, conducting a pump-purge, exposing the aerospace component to the first reactant, and conducting a pump-purge to form the first deposited layer. The order of the first precursor and the first reactant can be reversed, such that the ALD cycle includes exposing the surface of the aerospace component to the first reactant, conducting a pump-purge, exposing the aerospace component to the first precursor, and conducting a pump-purge to form the first deposited layer.

In some examples, during each ALD cycle, the aerospace component is exposed to the first precursor for about 0.1 seconds to about 10 seconds, the first reactant for about 0.1 seconds to about 10 seconds, and the pump-purge for about 0.5 seconds to about 30 seconds. In other examples, during each ALD cycle, the aerospace component is exposed to the first precursor for about 0.5 seconds to about 3 seconds, the first reactant for about 0.5 seconds to about 3 seconds, and the pump-purge for about 1 second to about 10 seconds.

Each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, or more times to form the first deposited layer. For example, each ALD cycle is repeated from 2 times to about 1,000 times, 2 times to about 800 times, 2 times to about 500 times, 2 times to about 300 times, 2 times to about 250 times, 2 times to about 200 times, 2 times to about 150 times, 2 times to about 120 times, 2 times to about 100 times, 2 times to about 80 times, 2 times to about 50 times, 2 times to about 30 times, 2 times to about 20 times, 2 times to about 15 times, 2 times to about 10 times, 2 to 5 times, about 8 times to about 1,000 times, about 8 times to about 800 times, about 8 times to about 500 times, about 8 times to about 300 times, about 8 times to about 250 times, about 8 times to about 200 times, about 8 times to about 150 times, about 8 times to about 120 times, about 8 times to about 100 times, about 8 times to about 80 times, about 8 times to about 50 times, about 8 times to about 30 times, about 8 times to about 20 times, about 8 times to about 15 times, about 8 times to about 10 times, about 20 times to about 1,000 times, about 20 times to about 800 times, about 20 times to about 500 times, about 20 times to about 300 times, about 20 times to about 250 times, about 20 times to about 200 times, about 20 times to about 150 times, about 20 times to about 120 times, about 20 times to about 100 times, about 20 times to about 80 times, about 20 times to about 50 times, about 20 times to about 30 times, about 50 times to about 1,000 times, about 50 times to about 500 times, about 50 times to about 350 times, about 50 times to about 300 times, about 50 times to about 250 times, about 50 times to about 150 times, or about 50 times to about 100 times to form the first deposited layer.

In other embodiments, the vapor deposition process is a CVD process and the method includes simultaneously exposing the aerospace component to the first precursor and the first reactant to form the first deposited layer. During an ALD process or a CVD process, each of the first precursor and the first reactant can independently include one or more carrier gases. One or more purge gases can be flowed across the aerospace component and/or throughout the processing chamber in between the exposures of the first precursor and the first reactant. In some examples, the same gas may be used as a carrier gas and a purge gas. Exemplary carrier gases and purge gases can independently be or include one or more of nitrogen ($N_2$), argon, helium, neon, hydrogen ($H_2$), or any combination thereof.

The first deposited layer can have a thickness of about 0.1 nm, about 0.2 nm, about 0.3 nm, about 0.4 nm, about 0.5 nm, about 0.8 nm, about 1 nm, about 2 nm, about 3 nm, about 5 nm, about 8 nm, about 10 nm, about 12 nm, or about 15 nm to about 18 nm, about 20 nm, about 25 nm, about 30 nm, about 40 nm, about 50 nm, about 60 nm, about 80 nm, about 100 nm, about 120 nm, or about 150 nm. For example, the first deposited layer can have a thickness of about 0.1 nm to about 150 nm, about 0.2 nm to about 150 nm, about 0.2 nm to about 120 nm, about 0.2 nm to about 100 nm, about 0.2 nm to about 80 nm, about 0.2 nm to about 50 nm, about 0.2 nm to about 40 nm, about 0.2 nm to about 30 nm, about 0.2 nm to about 20 nm, about 0.2 nm to about 10 nm, about 0.2 nm to about 5 nm, about 0.2 nm to about 1 nm, about 0.2 nm to about 0.5 nm, about 0.5 nm to about 150 nm, about 0.5 nm to about 120 nm, about 0.5 nm to about 100 nm, about 0.5 nm to about 80 nm, about 0.5 nm to about 50 nm, about 0.5 nm to about 40 nm, about 0.5 nm to about 30 nm, about 0.5 nm to about 20 nm, about 0.5 nm to about 10 nm, about 0.5 nm to about 5 nm, about 0.5 nm to about 1 nm, about 2 nm to about 150 nm, about 2 nm to about 120 nm, about 2 nm to about 100 nm, about 2 nm to about 80 nm, about 2 nm to about 50 nm, about 2 nm to about 40 nm, about 2 nm to about 30 nm, about 2 nm to about 20 nm, about 2 nm to about 10 nm, about 2 nm to about 5 nm, about 2 nm to about 3 nm, about 10 nm to about 150 nm, about 10 nm to about 120 nm, about 10 nm to about 100 nm, about 10 nm to about 80 nm, about 10 nm to about 50 nm, about 10 nm to about 40 nm, about 10 nm to about 30 nm, about 10 nm to about 20 nm, or about 10 nm to about 15 nm.

In one or more embodiments, the first precursor contains one or more chromium precursors, one or more aluminum precursors, or one or more hafnium precursors. The first reactant contains one or more reducing agents, one or more oxidizing agents, one or more nitriding agents, one or more silicon precursors, one or more carbon precursors, or any combination thereof. In some examples, the first deposited layer is a chromium-containing layer which can be or include metallic chromium, chromium oxide, chromium nitride, chromium silicide, chromium carbide, or any combination thereof. In other examples, the first deposited layer is an aluminum-containing layer which can be or include metallic aluminum, aluminum oxide, aluminum nitride, aluminum silicide, aluminum carbide, or any combination thereof. In further examples, the first deposited layer is a hafnium-containing layer which can be or include metallic hafnium, hafnium oxide, hafnium nitride, hafnium silicide, hafnium carbide, or any combination thereof.

The chromium precursor can be or include one or more of chromium cyclopentadiene compounds, chromium carbonyl compounds, chromium acetylacetonate compounds, chromium diazadienyl compounds, substitutes thereof, complexes thereof, abducts thereof, salts thereof, or any combination thereof. Exemplary chromium precursor can be or include bis(cyclopentadiene) chromium ($Cp_2Cr$), bis(pentamethylcyclopentadiene) chromium (($Me_5Cp)_2Cr$), bis(isoproplycyclopentadiene) chromium (($iPrCp)_2Cr$), bis(ethylbenzene) chromium (($EtBz)_2Cr$), chromium hexacarbonyl ($Cr(CO)_6$), chromium acetylacetonate ($Cr(acac)_3$, also known as, tris(2,4-pentanediono) chromium), chromium hexafluoroacetylacetonate ($Cr(hfac)_3$), chromium(III) tris(2, 2,6,6-tetramethyl-3,5-heptanedionate) $\{Cr(tmhd)_3\}$, chromium(II) bis(1,4-ditertbutyldiazadienyl), isomers thereof, complexes thereof, abducts thereof, salts thereof, or any combination thereof.

The aluminum precursor can be or include one or more of aluminum alkyl compounds, one or more of aluminum alkoxy compounds, one or more of aluminum acetylacetonate compounds, substitutes thereof, complexes thereof, abducts thereof, salts thereof, or any combination thereof. Exemplary aluminum precursors can be or include trimethylaluminum, triethylaluminum, tripropylaluminum, tributylaluminum, trimethoxyaluminum, triethoxyaluminum, tripropoxyaluminum, tributoxyaluminum, aluminum acetylacetonate (Al(acac)$_3$, also known as, tris(2,4-pentanediono) aluminum), aluminum hexafluoroacetylacetonate (Al(hfac)$_3$), trisdipivaloylmethanatoaluminum (DPM$_3$Al; (C$_{11}$H$_{19}$O$_2$)$_3$Al), isomers thereof, complexes thereof, abducts thereof, salts thereof, or any combination thereof.

In one or more examples, the precursor is or contains one or more aluminum alkyl compounds, such as trimethyl aluminum (TMA). The aluminum alkyl compound (e.g., TMA) has a purity of greater than 95%, greater than 97%, or greater than 99%, such as about 99.3%, about 99.5 wt %, about 99.7 wt %, or about 99.9 wt % to about 99.95 wt %, about 99.99 wt %, about 99.995 wt %, about 99.999 wt %, about 99.9999 wt %, or greater. In one or more examples, the aluminum alkyl compound (e.g., TMA) has a purity of 99.5 wt % or greater, such as about 99.9 wt % to about 99.999 wt %.

The hafnium precursor can be or include one or more of hafnium cyclopentadiene compounds, one or more of hafnium amino compounds, one or more of hafnium alkyl compounds, one or more of hafnium alkoxy compounds, substitutes thereof, complexes thereof, abducts thereof, salts thereof, or any combination thereof. Exemplary hafnium precursors can be or include bis(methylcyclopentadiene) dimethylhafnium ((MeCp)$_2$HfMe$_2$), bis(methylcyclopentadiene) methylmethoxyhafnium ((MeCp)$_2$Hf(OMe)(Me)), bis(cyclopentadiene) dimethylhafnium ((Cp)$_2$HfMe$_2$), tetra (tert-butoxy) hafnium, hafniumum isopropoxide ((iPrO)$_4$Hf), tetrakis(dimethylamino) hafnium (TDMAH), tetrakis(diethylamino) hafnium (TDEAH), tetrakis(ethylmethylamino) hafnium (TEMAH), isomers thereof, complexes thereof, abducts thereof, salts thereof, or any combination thereof.

The titanium precursor can be or include one or more of titanium cyclopentadiene compounds, one or more of titanium amino compounds, one or more of titanium alkyl compounds, one or more of titanium alkoxy compounds, substitutes thereof, complexes thereof, abducts thereof, salts thereof, or any combination thereof. Exemplary titanium precursors can be or include bis(methylcyclopentadiene) dimethyltitanium ((MeCp)$_2$TiMe$_2$), bis(methylcyclopentadiene) methylmethoxytitanium ((MeCp)$_2$Ti(OMe)(Me)), bis (cyclopentadiene) dimethyltitanium ((Cp)$_2$TiMe$_2$), tetra (tert-butoxy) titanium, titanium isopropoxide ((iPrO)$_4$Ti), tetrakis(dimethylamino) titanium (TDMAT), tetrakis(diethylamino) titanium (TDEAT), tetrakis(ethylmethylamino) titanium (TEMAT), isomers thereof, complexes thereof, abducts thereof, salts thereof, or any combination thereof.

In one or more examples, the first deposited layer is a chromium-containing layer which can be or include metallic chromium and the first reactant contains one or more reducing agents. In some examples, the first deposited layer is an aluminum-containing layer which can be or include metallic aluminum and the first reactant contains one or more reducing agents. In other examples, the first deposited layer is a hafnium-containing layer which can be or include metallic hafnium and the first reactant contains one or more reducing agents. Exemplary reducing agents can be or include hydrogen (H$_2$), ammonia, hydrazine, one or more hydrazine compounds, one or more alcohols, a cyclohexadiene, a dihydropyrazine, an aluminum containing compound, abducts thereof, salts thereof, plasma derivatives thereof, or any combination thereof.

In some examples, the first deposited layer is a chromium-containing layer which can be or include chromium oxide and the first reactant contains one or more oxidizing agents. In other examples, the first deposited layer is an aluminum-containing layer which can be or include aluminum oxide and the first reactant contains one or more oxidizing agents. In further examples, the first deposited layer is a hafnium-containing layer which can be or include hafnium oxide and the first reactant contains one or more oxidizing agents. Exemplary oxidizing agents can be or include water (e.g., steam), oxygen (O$_2$), atomic oxygen, ozone, nitrous oxide, one or more peroxides, one or more alcohols, plasmas thereof, or any combination thereof.

In one or more examples, the first deposited layer is a chromium-containing layer which can be or include chromium nitride and the first reactant contains one or more nitriding agents. In other examples, the first deposited layer is an aluminum-containing layer which can be or include aluminum nitride and the first reactant contains one or more nitriding agents. In some examples, the first deposited layer is a hafnium-containing layer which can be or include hafnium nitride and the first reactant contains one or more nitriding agents. Exemplary nitriding agents can be or include ammonia, atomic nitrogen, one or more hydrazines, nitric oxide, plasmas thereof, or any combination thereof.

In one or more examples, the first deposited layer is a chromium-containing layer which can be or include chromium silicide and the first reactant contains one or more silicon precursors. In some examples, the first deposited layer is an aluminum-containing layer which can be or include aluminum silicide and the first reactant contains one or more silicon precursors. In other examples, the first deposited layer is a hafnium-containing layer which can be or include hafnium silicide and the first reactant contains one or more silicon precursors. Exemplary silicon precursors can be or include silane, disilane, trisilane, tetrasilane, pentasilane, hexasilane, monochlorosilane, dichlorosilane, trichlorosilane, tetrachlorosilane, hexachlorosilane, substituted silanes, plasma derivatives thereof, or any combination thereof.

In some examples, the first deposited layer is a chromium-containing layer which can be or include chromium carbide and the first reactant contains one or more carbon precursors. In other examples, the first deposited layer is an aluminum-containing layer which can be or include aluminum carbide and the first reactant contains one or more carbon precursors. In further examples, the first deposited layer is a hafnium-containing layer which can be or include hafnium carbide and the first reactant contains one or more carbon precursors. Exemplary carbon precursors can be or include one or more alkanes, one or more alkenes, one or more alkynes, substitutes thereof, plasmas thereof, or any combination thereof.

In some embodiments, the aerospace component can be exposed to a second precursor and a second reactant to form the second deposited layer on the first deposited layer by an ALD process producing nanolaminate film. The first deposited layer and second deposited layer have different compositions from each other. In some examples, the first precursor is a different precursor than the second precursor, such as that the first precursor is a source of a first type of metal and the second precursor is a source of a second type of metal and the first and second types of metal are different.

The second precursor can be or include one or more aluminum precursors, one or more hafnium precursors, one or more yttrium precursors, or any combination thereof. The second reactant can be any other reactants used as the first reactant. For example, the second reactant can be or include one or more reducing agents, one or more oxidizing agents, one or more nitriding agents, one or more silicon precursors, one or more carbon precursors, or any combination thereof, as described and discussed above. During the ALD process, each of the second precursor and the second reactant can independently include one or more carrier gases. One or more purge gases can be flowed across the aerospace component and/or throughout the processing chamber in between the exposures of the second precursor and the second reactant. In some examples, the same gas may be used as a carrier gas and a purge gas. Exemplary carrier gases and purge gases can independently be or include one or more of nitrogen ($N_2$), argon, helium, neon, hydrogen ($H_2$), or any combination thereof.

In one or more embodiments, the second deposited layer contains aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof. In one or more examples, if the first deposited layer contains aluminum oxide or aluminum nitride, then the second deposited layer does not contain aluminum oxide or aluminum nitride. Similarly, if the first deposited layer contains hafnium oxide or hafnium nitride, then the second deposited layer does not contain hafnium oxide or hafnium nitride.

Each cycle of the ALD process includes exposing the aerospace component to the second precursor, conducting a pump-purge, exposing the aerospace component to the second reactant, and conducting a pump-purge to form the second deposited layer. The order of the second precursor and the second reactant can be reversed, such that the ALD cycle includes exposing the surface of the aerospace component to the second reactant, conducting a pump-purge, exposing the aerospace component to the second precursor, and conducting a pump-purge to form the second deposited layer.

In one or more examples, during each ALD cycle, the aerospace component is exposed to the second precursor for about 0.1 seconds to about 10 seconds, the second reactant for about 0.1 seconds to about 10 seconds, and the pump-purge for about 0.5 seconds to about 30 seconds. In other examples, during each ALD cycle, the aerospace component is exposed to the second precursor for about 0.5 seconds to about 3 seconds, the second reactant for about 0.5 seconds to about 3 seconds, and the pump-purge for about 1 second to about 10 seconds.

Each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, or more times to form the second deposited layer. For example, each ALD cycle is repeated from 2 times to about 1,000 times, 2 times to about 800 times, 2 times to about 500 times, 2 times to about 300 times, 2 times to about 250 times, 2 times to about 200 times, 2 times to about 150 times, 2 times to about 120 times, 2 times to about 100 times, 2 times to about 80 times, 2 times to about 50 times, 2 times to about 30 times, 2 times to about 20 times, 2 times to about 15 times, 2 times to about 10 times, 2 times to 5 times, about 8 times to about 1,000 times, about 8 times to about 800 times, about 8 times to about 500 times, about 8 times to about 300 times, about 8 times to about 250 times, about 8 times to about 200 times, about 8 times to about 150 times, about 8 times to about 120 times, about 8 times to about 100 times, about 8 times to about 80 times, about 8 times to about 50 times, about 8 times to about 30 times, about 8 times to about 20 times, about 8 times to about 15 times, about 8 times to about 10 times, about 20 times to about 1,000 times, about 20 times to about 800 times, about 20 times to about 500 times, about 20 times to about 300 times, about 20 times to about 250 times, about 20 times to about 200 times, about 20 times to about 150 times, about 20 times to about 120 times, about 20 times to about 100 times, about 20 times to about 80 times, about 20 times to about 50 times, about 20 times to about 30 times, about 50 times to about 1,000 times, about 50 times to about 500 times, about 50 times to about 350 times, about 50 times to about 300 times, about 50 times to about 250 times, about 50 times to about 150 times, or about 50 times to about 100 times to form the second deposited layer.

The second deposited layer can have a thickness of about 0.1 nm, about 0.2 nm, about 0.3 nm, about 0.4 nm, about 0.5 nm, about 0.8 nm, about 1 nm, about 2 nm, about 3 nm, about 5 nm, about 8 nm, about 10 nm, about 12 nm, or about 15 nm to about 18 nm, about 20 nm, about 25 nm, about 30 nm, about 40 nm, about 50 nm, about 60 nm, about 80 nm, about 100 nm, about 120 nm, or about 150 nm. For example, the second deposited layer can have a thickness of about 0.1 nm to about 150 nm, about 0.2 nm to about 150 nm, about 0.2 nm to about 120 nm, about 0.2 nm to about 100 nm, about 0.2 nm to about 80 nm, about 0.2 nm to about 50 nm, about 0.2 nm to about 40 nm, about 0.2 nm to about 30 nm, about 0.2 nm to about 20 nm, about 0.2 nm to about 10 nm, about 0.2 nm to about 5 nm, about 0.2 nm to about 1 nm, about 0.2 nm to about 0.5 nm, about 0.5 nm to about 150 nm, about 0.5 nm to about 120 nm, about 0.5 nm to about 100 nm, about 0.5 nm to about 80 nm, about 0.5 nm to about 50 nm, about 0.5 nm to about 40 nm, about 0.5 nm to about 30 nm, about 0.5 nm to about 20 nm, about 0.5 nm to about 10 nm, about 0.5 nm to about 5 nm, about 0.5 nm to about 1 nm, about 2 nm to about 150 nm, about 2 nm to about 120 nm, about 2 nm to about 100 nm, about 2 nm to about 80 nm, about 2 nm to about 50 nm, about 2 nm to about 40 nm, about 2 nm to about 30 nm, about 2 nm to about 20 nm, about 2 nm to about 10 nm, about 2 nm to about 5 nm, about 2 nm to about 3 nm, about 10 nm to about 150 nm, about 10 nm to about 120 nm, about 10 nm to about 100 nm, about 10 nm to about 80 nm, about 10 nm to about 50 nm, about 10 nm to about 40 nm, about 10 nm to about 30 nm, about 10 nm to about 20 nm, or about 10 nm to about 15 nm.

In some examples, the first deposited layer is a chromium-containing layer that contains chromium oxide, chromium nitride, or a combination thereof, and the second deposited layer contains one or more of aluminum oxide, silicon nitride, hafnium oxide, hafnium silicate, titanium oxide, or any combination thereof.

In one or more embodiments, the protective coating or the nanolaminate film stack can contain from 1, 2, 3, 4, 5, 6, 7, 8, or 9 pairs of the first and second deposited layers to about 10, about 12, about 15, about 20, about 25, about 30, about 40, about 50, about 65, about 80, about 100, about 120, about 150, about 200, about 250, about 300, about 500, about 800, or about 1,000 pairs of the first and second deposited layers. For example, the nanolaminate film stack can contain from 1 to about 1,000, 1 to about 800, 1 to about 500, 1 to about 300, 1 to about 250, 1 to about 200, 1 to about 150, 1 to about 120, 1 to about 100, 1 to about 80, 1 to about 65, 1 to about 50, 1 to about 30, 1 to about 20, 1 to about 15, 1 to about 10, 1 to about 8, 1 to about 6, 1 to 5, 1 to 4, 1 to 3, about 5 to about 150, about 5 to about 120, about 5 to about 100, about 5 to about 80, about 5 to about 65, about 5 to about 50, about 5 to about 30, about 5 to about 20, about 5 to about 15, about 5 to about 10, about 5 to about 8, about 5 to about 7, about 10 to about 150, about 10 to about 120, about 10 to about 100, about 10 to about 80, about 10 to about 65, about 10 to about 50, about 10 to about 30, about 10 to about 20, about 10 to about 15, or about 10 to about 12 pairs of the first and second deposited layers.

The protective coating or the nanolaminate film stack can have a thickness of about 1 nm, about 2 nm, about 3 nm, about 5 nm, about 8 nm, about 10 nm, about 12 nm, about 15 nm, about 20 nm, about 30 nm, about 50 nm, about 60 nm, about 80 nm, about 100 nm, or about 120 nm to about 150 nm, about 180 nm, about 200 nm, about 250 nm, about 300 nm, about 350 nm, about 400 nm, about 500 nm, about 800 nm, about 1,000 nm, about 2,000 nm, about 3,000 nm, about 4,000 nm, about 5,000 nm, about 6,000 nm, about 7,000 nm, about 8,000 nm, about 9,000 nm, about 10,000 nm, or thicker. In some examples, the protective coating or the nanolaminate film stack can have a thickness of less than 10 μm (less than 10,000 nm). For example, the protective coating or the nanolaminate film stack can have a thickness of about 1 nm to less than 10,000 nm, about 1 nm to about 8,000 nm, about 1 nm to about 6,000 nm, about 1 nm to about 5,000 nm, about 1 nm to about 3,000 nm, about 1 nm to about 2,000 nm, about 1 nm to about 1,500 nm, about 1 nm to about 1,000 nm, about 1 nm to about 500 nm, about 1 nm to about 400 nm, about 1 nm to about 300 nm, about 1 nm to about 250 nm, about 1 nm to about 200 nm, about 1 nm to about 150 nm, about 1 nm to about 100 nm, about 1 nm to about 80 nm, about 1 nm to about 50 nm, about 20 nm to about 500 nm, about 20 nm to about 400 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 30 nm to about 400 nm, about 30 nm to about 200 nm, about 50 nm to about 500 nm, about 50 nm to about 400 nm, about 50 nm to about 300 nm, about 50 nm to about 250 nm, about 50 nm to about 200 nm, about 50 nm to about 150 nm, about 50 nm to about 100 nm, about 80 nm to about 250 nm, about 80 nm to about 200 nm, about 80 nm to about 150 nm, about 80 nm to about 100 nm, about 50 nm to about 80 nm, about 100 nm to about 500 nm, about 100 nm to about 400 nm, about 100 nm to about 300 nm, about 100 nm to about 250 nm, about 100 nm to about 200 nm, or about 100 nm to about 150 nm.

In some embodiments, the nanolaminate film stack can optionally be exposed to one or more annealing processes. In some examples, the nanolaminate film stack can be converted into the coalesced film or crystalline film during the annealing process. During the annealing process, the high temperature coalesces the layers within the nanolaminate film stack into a single structure where the new crystalline assembly enhances the integrity and protective properties of the coalesced film or crystalline film. In other examples, the nanolaminate film stack can be heated and densified during the annealing process, but still maintained as a nanolaminate film stack. The annealing process can be or include a thermal anneal, a plasma anneal, an ultraviolet anneal, a laser anneal, or any combination thereof.

The nanolaminate film stack disposed on the aerospace component is heated to a temperature of about 400° C., about 500° C., about 600° C., or about 700° C. to about 750° C., about 800° C., about 900° C., about 1,000° C., about 1,100° C., about 1,200° C., or greater during the annealing process. For example, the nanolaminate film stack disposed on the aerospace component is heated to a temperature of about 400° C. to about 1,200° C., about 400° C. to about 1,100° C., about 400° C. to about 1,000° C., about 400° C. to about 900° C., about 400° C. to about 800° C., about 400° C. to about 700° C., about 400° C. to about 600° C., about 400° C. to about 500° C., about 550° C. to about 1,200° C., about 550° C. to about 1,100° C., about 550° C. to about 1,000° C., about 550° C. to about 900° C., about 550° C. to about 800° C., about 550° C. to about 700° C., about 550° C. to about 600° C., about 700° C. to about 1,200° C., about 700° C. to about 1,100° C., about 700° C. to about 1,000° C., about 700° C. to about 900° C., about 700° C. to about 800° C., about 850° C. to about 1,200° C., about 850° C. to about 1,100° C., about 850° C. to about 1,000° C., or about 850° C. to about 900° C. during the annealing process.

The nanolaminate film stack can be under a vacuum at a low pressure (e.g., from about 0.1 Torr to less than 760 Torr), at ambient pressure (e.g., about 760 Torr), and/or at a high pressure (e.g., from greater than 760 Torr (1 atm) to about 3,678 Torr (about 5 atm)) during the annealing process. The nanolaminate film stack can be exposed to an atmosphere containing one or more gases during the annealing process. Exemplary gases used during the annealing process can be or include nitrogen ($N_2$), argon, helium, hydrogen ($H_2$), oxygen ($O_2$), or any combinations thereof. The annealing process can be performed for about 0.01 seconds to about 10 minutes. In some examples, the annealing process can be a thermal anneal and lasts for about 1 minute, about 5 minutes, about 10 minutes, or about 30 minutes to about 1 hour, about 2 hours, about 5 hours, or about 24 hours. In other examples, the annealing process can be a laser anneal or a spike anneal and lasts for about 1 millisecond, about 100 millisecond, or about 1 second to about 5 seconds, about 10 seconds, or about 15 seconds.

The protective coating or the coalesced film or crystalline film can have a thickness of about 1 nm, about 2 nm, about 3 nm, about 5 nm, about 8 nm, about 10 nm, about 12 nm, about 15 nm, about 20 nm, about 30 nm, about 50 nm, about 60 nm, about 80 nm, about 100 nm, or about 120 nm to about 150 nm, about 180 nm, about 200 nm, about 250 nm, about 300 nm, about 350 nm, about 400 nm, about 500 nm, about 700 nm, about 850 nm, about 1,000 nm, about 1,200 nm, about 1,500 nm, about 2,000 nm, about 3,000 nm, about 4,000 nm, about 5,000 nm, about 6,000 nm, about 7,000 nm, about 8,000 nm, about 9,000 nm, about 10,000 nm, or thicker. In some examples, the protective coating or the coalesced film or crystalline film can have a thickness of less than 10 μm (less than 10,000 nm). For example, the protective coating or the coalesced film or crystalline film can have a thickness of about 1 nm to less than 10,000 nm, about 1 nm to about 8,000 nm, about 1 nm to about 6,000 nm, about 1 nm to about 5,000 nm, about 1 nm to about 3,000 nm, about 1 nm to about 2,000 nm, about 1 nm to about 1,500 nm, about 1 nm to about 1,000 nm, about 1 nm to about 500 nm, about 1 nm to about 400 nm, about 1 nm to about 300 nm, about 1 nm to about 250 nm, about 1 nm to about 200 nm, about 1 nm to about 150 nm, about 1 nm to about 100 nm, about 1 nm to about 80 nm, about 1 nm to about 50 nm, about 20 nm to about 500 nm, about 20 nm to about 400 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 30 nm to about 400 nm, about 30 nm to about 200 nm, about 50 nm to about 500 nm, about 50 nm to about 400 nm, about 50 nm to about 300 nm, about 50 nm to about 250 nm, about 50 nm to about 200 nm, about 50 nm to about 150 nm, about 50 nm to about 100 nm, about 80 nm to about 250 nm, about 80 nm to about 200 nm, about 80 nm to about 150 nm, about 80 nm to about 100 nm, about 50 nm to about 80 nm, about 100 nm to about 500 nm, about 100 nm to about 400 nm, about 100 nm to about 300 nm, about 100 nm to about 250 nm, about 100 nm to about 200 nm, or about 100 nm to about 150 nm.

In one or more embodiments, the protective coating can have a relatively high degree of uniformity. The protective coating can have a uniformity of less than 50%, less than 40%, or less than 30% of the thickness of the respective protective coating. The protective coating can have a uniformity from about 0%, about 0.5%, about 1%, about 2%, about 3%, about 5%, about 8%, or about 10% to about 12%, about 15%, about 18%, about 20%, about 22%, about 25%, about 28%, about 30%, about 35%, about 40%, about 45%, or less than 50% of the thickness. For example, the protective coating can have a uniformity from about 0% to about 50%, about 0% to about 40%, about 0% to about 30%, about 0% to less than 30%, about 0% to about 28%, about 0% to about 25%, about 0% to about 20%, about 0% to about 15%, about 0% to about 10%, about 0% to about 8%, about 0% to about 5%, about 0% to about 3%, about 0% to about 2%, about 0% to about 1%, about 1% to about 50%, about 1% to about 40%, about 1% to about 30%, about 1% to less than 30%, about 1% to about 28%, about 1% to about 25%, about 1% to about 20%, about 1% to about 15%, about 1% to about 10%, about 1% to about 8%, about 1% to about 5%, about 1% to about 3%, about 1% to about 2%, about 5% to about 50%, about 5% to about 40%, about 5% to about 30%, about 5% to less than 30%, about 5% to about 28%, about 5% to about 25%, about 5% to about 20%, about 5% to about 15%, about 5% to about 10%, about 5% to about 8%, about 10% to about 50%, about 10% to about 40%, about 10% to about 30%, about 10% to less than 30%, about 10% to about 28%, about 10% to about 25%, about 10% to about 20%, about 10% to about 15%, or about 10% to about 12% of the thickness.

In some embodiments, the protective coating can contain, be formed with, or otherwise produced with different ratios of metals throughout the material, such as one or more doping metals and/or one or more grading metals contained within a base metal, where any of the metals can be in any chemically oxidized form or state (e.g., oxide, nitride, silicide, carbide, or combinations thereof). In one or more examples, the first deposited layer is deposited to first thickness and the second deposited layer is deposited to a second thickness. The first thickness can be the same as the second thickness or the first thickness can be different than (less than or greater than) the second thickness. For example, the first deposited layer can be deposited by two or more (3, 4, 5, 6, 7, 8, 9, 10, or more) ALD cycles to produce the respectively same amount of sub-layers (e.g., one sub-layer for each ALD cycle), and then the second deposited layer can be deposited by one ALD cycle or a number of ALD cycles that is less than or greater than the number of ALD cycles used to deposit the first deposited layer. In other examples, the first deposited layer can be deposited by CVD to a first thickness and the second deposited layer is deposited by ALD to a second thickness which is less than the first thickness.

In other embodiments, an ALD process can be used to deposit the first deposited layer and/or the second deposited layer where the deposited material is doped by including a dopant precursor during the ALD process. In some examples, the dopant precursor can be included in a separate ALD cycle relative to the ALD cycles used to deposit the base material. In other examples, the dopant precursor can be co-injected with any of the chemical precursors used during the ALD cycle. In further examples, the dopant precursor can be injected separately from the chemical precursors during the ALD cycle. For example, one ALD cycle can include exposing the aerospace component to: the first precursor, a pump-purge, the dopant precursor, a pump-purge, the first reactant, and a pump-purge to form the deposited layer. In some examples, one ALD cycle can include exposing the aerospace component to: the dopant precursor, a pump-purge, the first precursor, a pump-purge, the first reactant, and a pump-purge to form the deposited layer. In other examples, one ALD cycle can include exposing the aerospace component to: the first precursor, the dopant precursor, a pump-purge, the first reactant, and a pump-purge to form the deposited layer.

In one or more embodiments, the first deposited layer and/or the second deposited layer contains one or more base materials and one or more doping materials. The base material is or contains aluminum oxide, chromium oxide, or a combination of aluminum oxide and chromium oxide. The doping material is or contains hafnium, hafnium oxide, yttrium, yttrium oxide, cerium, cerium oxide, silicon, silicon oxide, nitrides thereof, or any combination thereof. Any of the precursors or reagents described herein can be used as a doping precursor or a dopant. Exemplary cerium precursor can be or include one or more cerium(IV) tetra(2,2,6,6-tetramethyl-3,5-heptanedionate) ($Ce(TMHD)_4$), tris(cyclopentadiene) cerium (($C_5H_5)_3Ce$), tris(propylcyclopentadiene) cerium ($[(C_3H_7)C_5H_4]_3Ce$), tris(tetramethylcyclopentadiene) cerium ($[(CH_3)_4C_5H]_3Ce$), or any combination thereof.

The doping material can have a concentration of about 0.01 atomic percent (at %), about 0.05 at %, about 0.08 at %, about 0.1 at %, about 0.5 at %, about 0.8 at %, about 1 at %, about 1.2 at %, about 1.5 at %, about 1.8 at %, or about 2 at % to about 2.5 at %, about 3 at %, about 3.5 at %, about 4 at %, about 5 at %, about 8 at %, about 10 at %, about 15 at %, about 20 at %, about 25 at %, or about 30 at % within the first deposited layer, the second deposited layer, the nanolaminate film stack, and/or the coalesced film or crystalline film. For example, the doping material can have a concentration of about 0.01 at % to about 30 at %, about 0.01 at % to about 25 at %, about 0.01 at % to about 20 at %, about 0.01 at % to about 15 at %, about 0.01 at % to about 12 at %, about 0.01 at % to about 10 at %, about 0.01 at % to about 8 at %, about 0.01 at % to about 5 at %, about 0.01 at % to about 4 at %, about 0.01 at % to about 3 at %, about 0.01 at % to about 2.5 at %, about 0.01 at % to about 2 at %, about 0.01 at % to about 1.5 at %, about 0.01 at % to about 1 at %, about 0.01 at % to about 0.5 at %, about 0.01 at % to about 0.1 at %, about 0.1 at % to about 30 at %, about 0.1 at % to about 25 at %, about 0.1 at % to about 20 at %, about 0.1 at % to about 15 at %, about 0.1 at % to about 12 at %, about 0.1 at % to about 10 at %, about 0.1 at % to about 8 at %, about 0.1 at % to about 5 at %, about 0.1 at % to about 4 at %, about 0.1 at % to about 3 at %, about 0.1 at % to about 2.5 at %, about 0.1 at % to about 2 at %, about 0.1 at % to about 1.5 at %, about 0.1 at % to about 1 at %, about 0.1 at % to about 0.5 at %, about 1 at % to about 30 at %, about 1 at % to about 25 at %, about 1 at % to about 20 at %, about 1 at % to about 15 at %, about 1 at % to about 12 at %, about 1 at % to about 10 at %, about 1 at % to about 8 at %, about 1 at % to about 5 at %, about 1 at % to about 4 at %, about 1 at % to about 3 at %, about 1 at % to about 2.5 at %, about 1 at % to about 2 at %, or about 1 at % to about 1.5 at % within the first deposited layer, the second deposited layer, the nanolaminate film stack, and/or the coalesced film or crystalline film.

In one or more embodiments, the protective coating includes the nanolaminate film stack having the first deposited layer containing aluminum oxide (or other base material) and the second deposited layer containing hafnium oxide (or other doping material), or having the first deposited layer containing hafnium oxide (or other doping material) and the second deposited layer containing aluminum oxide (or other base material). In one or more examples, the protective coating contains a combination of aluminum oxide and hafnium oxide, a hafnium-doped aluminum oxide, hafnium aluminate, or any combination thereof. For example, the protective coating includes the nanolaminate film stack having the first deposited layer containing aluminum oxide and the second deposited layer containing hafnium oxide, or having the first deposited layer containing hafnium oxide and the second deposited layer contains aluminum oxide. In other examples, the protective coating includes the coalesced film or crystalline film formed from layers of aluminum oxide and hafnium oxide. In one or more embodiments, the protective coating has a concentration of hafnium (or other doping material) of about 0.01 at %, about 0.05 at %, about 0.08 at %, about 0.1 at %, about 0.5 at %, about 0.8 at %, or about 1 at % to about 1.2 at %, about 1.5 at %, about 1.8 at %, about 2 at %, about 2.5 at %, about 3 at %, about 3.5 at %, about 4 at %, about 4.5 at %, or about 5 at % within the nanolaminate film stack or the coalesced film or crystalline film containing aluminum oxide (or other base material). For example, the protective coating has a concentration of hafnium (or other doping material) of about 0.01 at % to about 10 at %, about 0.01 at % to about 8 at %, about 0.01 at % to about 5 at %, about 0.01 at % to about 4 at %, about 0.01 at % to about 3 at %, about 0.01 at % to about 2.5 at %, about 0.01 at % to about 2 at %, about 0.01 at % to about 1.5 at %, about 0.01 at % to about 1 at %, about 0.01 at % to about 0.5 at %, about 0.01 at % to about 0.1 at %, about 0.01 at % to about 0.05 at %, about 0.1 at % to about 5 at %, about 0.1 at % to about 4 at %, about 0.1 at % to about 3 at %, about 0.1 at % to about 2.5 at %, about 0.1 at % to about 2 at %, about 0.1 at % to about 1.5 at %, about 0.1 at % to about 1 at %, about 0.1 at % to about 0.5 at %, about 0.5 at % to about 5 at %, about 0.5 at % to about 4 at %, about 0.5 at % to about 3 at %, about 0.5 at % to about 2.5 at %, about 0.5 at % to about 2 at %, about 0.5 at % to about 1.5 at %, about 0.5 at % to about 1 at %, about 1 at % to about 5 at %, about 1 at % to about 4 at %, about 1 at % to about 3 at %, about 1 at % to about 2.5 at %, about 1 at % to about 2 at %, or about 1 at % to about 1.5 at % within the nanolaminate film stack or the coalesced film or crystalline film containing aluminum oxide (or other base material).

Figure 7B:
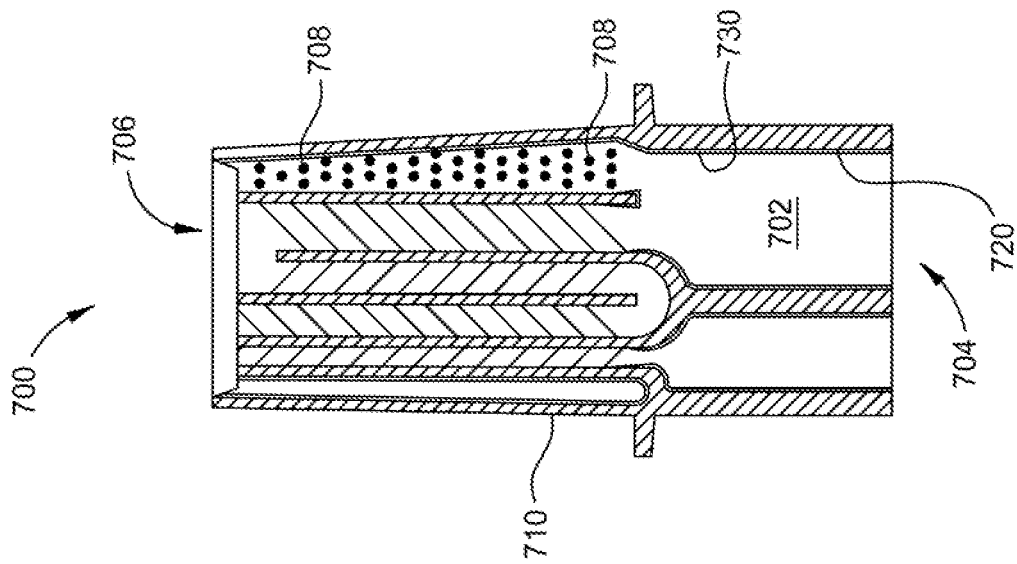
FIGS. 7A-7B are schematic views of a refurbished aerospace component containing one or more protective coatings, according to one or more embodiments described and discussed herein.
Figure 7A:
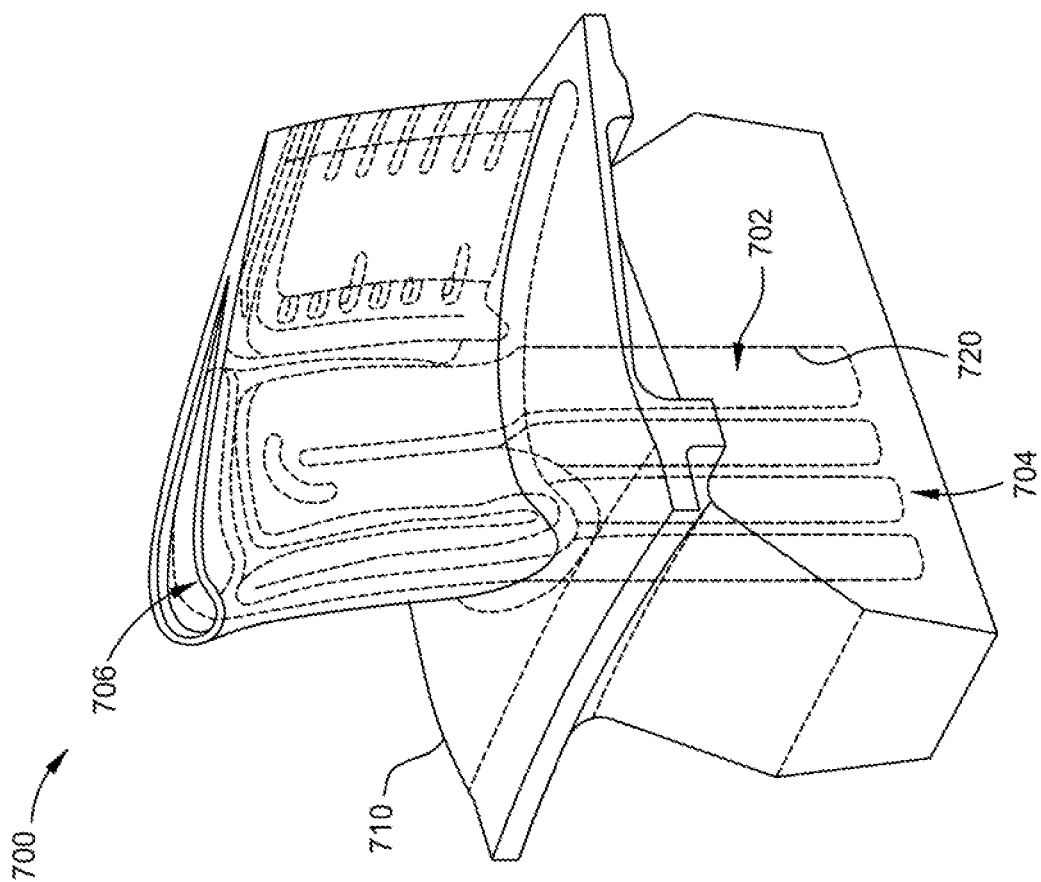

FIGS. 7A and 7B are schematic views of an aerospace component 700 containing a protective coating 730, according to one or more embodiments described and discussed herein. FIG. 7A is a perspective view of the aerospace component 700 and FIG. 7B is a cross-sectional view of the aerospace component 700. The protective coating 730 can be or include the protective coating 140 (FIGS. 1C, 3D, and 5D). Similarly, the aerospace component 700 can be or include the substrate or aerospace component 110 (FIGS. 1A-1C, 3A-3D, and 5A-5D). The refurbished aerospace component 110 or 700 can be refurbished, repaired, formed, or otherwise produced by any one of the methods described and discussed herein.

Although the aerospace component 700 is illustrated as a turbine blade in FIGS. 7A and 7B, the methods described and discussed here can be conducted or performed on other types of aerospace components, as well as other types of substrates and devices. Aerospace components as described and discussed herein, including the aerospace component 700, can be or include one or more components, parts, or portions thereof of a turbine, an aircraft, a spacecraft, a windmill, a ground-based power generation system, a fuel system, or other devices that can include one or more turbines (e.g., generators, compressors, pumps, turbo fans, super chargers, and the like). Exemplary aerospace components 700 and substrates or aerospace components 110 can be or include a turbine blade, a turbine blade root (e.g., fir tree or dovetail), a turbine disk, a turbine vane, a support member, a frame, a rib, a fin, a pin fin, a fuel nozzle, a combustor liner, a combustor shield, a heat exchanger, a fuel line, a fuel valve, any other part or portion that is exposed to a fuel (e.g., aviation fuel or jet fuel), an internal cooling channel, or any other aerospace component or part that can benefit from having a protective coating deposited thereon, or any combination thereof. The aerospace component 110, 700 typically has a thickness of about 1 mm, about 1.5 mm, or about 2 mm to about 3 mm, about 5 mm, about 8 mm, or about 10 mm. For example, the aerospace component 110, 700 can have a thickness of about 1 mm to about 5 mm or about 2 mm to about 3 mm.

The aerospace component 700 has one or more outer or exterior surfaces 710 and one or more inner or interior surfaces 720. The interior surfaces 720 can define one or more cavities 702 extending or contained within the aerospace component 700. The cavities 702 can be channels, passages, spaces, or the like disposed between the interior surfaces 720. The cavity 702 can have one or more openings 704, 706, and 708. Each of the cavities 702 within the aerospace component 700 typically have aspect ratios (e.g., length divided by width) of greater than 1. The methods described and discussed herein provide depositing and/or otherwise forming the protective coating 730 on the interior surfaces 720 with high aspect ratios (greater than 1) and/or within the cavities 702.

The aspect ratio of the cavity 702 can be from about 2, about 3, about 5, about 8, about 10, or about 12 to about 15, about 20, about 25, about 30, about 40, about 50, about 65, about 80, about 100, about 120, about 150, about 200, about 250, about 300, about 500, about 800, about 1,000, or greater. For example, the aspect ratio of the cavity 702 can be from about 2 to about 1,000, about 2 to about 500, about 2 to about 200, about 2 to about 150, about 2 to about 120, about 2 to about 100, about 2 to about 80, about 2 to about 50, about 2 to about 40, about 2 to about 30, about 2 to about 20, about 2 to about 10, about 2 to about 8, about 5 to about 1,000, about 5 to about 500, about 5 to about 200, about 5 to about 150, about 5 to about 120, about 5 to about 100, about 5 to about 80, about 5 to about 50, about 5 to about 40, about 5 to about 30, about 5 to about 20, about 5 to about 10, about 5 to about 8, about 10 to about 1,000, about 10 to about 500, about 10 to about 200, about 10 to about 150, about 10 to about 120, about 10 to about 100, about 10 to about 80, about 10 to about 50, about 10 to about 40, about 10 to about 30, about 10 to about 20, about 20 to about 1,000, about 20 to about 500, about 20 to about 200, about 20 to about 150, about 20 to about 120, about 20 to about 100, about 20 to about 80, about 20 to about 50, about 20 to about 40, or about 20 to about 30.

The aerospace component 700 and any surface thereof including one or more outer or exterior surfaces 710 and/or one or more inner or interior surfaces 720 can be made of, contain, or otherwise include one or more metals, such as nickel, one or more nickel superalloys, one or more nickel-aluminum alloys, aluminum, iron, one or more stainless steels, cobalt, chromium, molybdenum, titanium, CMSX® superalloys (e.g., CMSX®-2, CMSX®-4, CMSX®-4+, or CMSX®-10 superalloys, commercially from Cannon-Muskegon Corporation), one or more Inconel alloys, one or more Hastelloy alloys, one or more Invar alloys, one or more Inovoco alloys, alloys thereof, or any combination thereof. In one or more embodiments, the main body of the aerospace component 700 contains nickel, such as a nickel alloy or a nickel superalloy. On the outer or exterior surfaces 710 and/or the inner or interior surfaces 720, the aerospace component 700 can have one or more aluminide layers disposed on the nickel superalloy and one or more aluminum oxide layers disposed on the aluminide layer. The protective coating 730 can be deposited, formed, or otherwise produced on any surface of the aerospace component 700 including the aluminum oxide layer and/or the aluminide layer on the outer or exterior surfaces 710 and/or the inner or interior surfaces 720.

The protective coating, as described and discussed herein, can be or include one or more of laminate film stacks, coalesced films, crystalline film, graded compositions, and/or monolithic films which are deposited or otherwise formed on any surface of an aerospace component. In some examples, the protective coating contains from about 1% to about 100% chromium oxide. The protective coating is conformal and substantially coat rough surface features following surface topology, including in open pores, blind holes, and non-line-of sight regions of a surface. The protective coating does not substantially increase surface roughness, and in some embodiments, the protective coating may reduce surface roughness by conformally coating roughness until it coalesces. The protective coating may contain particles from the deposition that are substantially larger than the roughness of the aerospace component, but are considered separate from the monolithic film. The protective coating is substantially well adhered and pinhole free. The thicknesses of the protective coating can vary within 1-sigma of 40%. In one or more embodiments, the thickness varies less than 1-sigma of 20%, 10%, 5%, 1%, or 0.1%.

The protective coating provides corrosion and oxidation protection when the aerospace components are exposed to air, oxygen, sulfur and/or sulfur compounds, acids, bases, salts (e.g., Na, K, Mg, Li, or Ca salts), or any combination thereof. In some embodiments, protective coating provides protection against coke deposition. The aerospace component may be exposed to these conditions during normal operation or during a cleaning process to remove any carbon buildup from the protective coating. In one or more embodiments, the protective coating reduces or suppresses coke formation when the aerospace component is heated in the presence of a fuel, such as an aviation fuel, jet fuel, kerosene, or the like. In some examples, the protective coating can be or include one or more material, such as aluminum oxide, aluminum nitride, aluminum oxynitride, silicon oxide, silicon nitride, silicon oxynitride, chromium oxide, tantalum oxide, tantalum nitride, tantalum oxynitride, alloys thereof, or any combination thereof.

One or more embodiments described herein include methods for the preservation of an underneath chromium-containing alloy using the methods producing an alternating nanolaminate of first material (e.g., chromium oxide, aluminum oxide, and/or aluminum nitride) and another secondary material. The secondary material can be or include one or more of aluminum oxide, aluminum nitride, aluminum oxynitride, silicon oxide, silicon nitride, silicon carbide, yttrium oxide, yttrium nitride, yttrium silicon nitride, hafnium oxide, hafnium silicate, hafnium silicide, hafnium nitride, titanium oxide, titanium nitride, titanium silicide, titanium silicate, tantalum oxide, tantalum nitride, tantalum silicide, tantalum silicate, dopants thereof, alloys thereof, or any combination thereof. The resultant film can be used as a nanolaminate film stack or the film can be subjected to annealing where the high temperature coalesces the films into a single structure where the new crystalline assembly enhances the integrity and protective properties of this overlying film.

In a particular embodiment, the chromium precursor (at a temperature of about 0° C. to about 250° C.) is delivered to the aerospace component via vapor phase delivery for at pre-determined pulse length of about 5 seconds. During this process, the deposition reactor is operated under a flow of nitrogen carrier gas (about 1,000 sccm total) with the chamber held at a pre-determined temperature of about 350° C. and pressure of about 3.5 Torr. After the pulse of the chromium precursor, the chamber is then subsequently pumped and purged of all requisite gases and byproducts for a determined amount of time. Subsequently, water (or another oxidizing agent) is pulsed into the chamber for about 0.1 seconds at chamber pressure of about 3.5 Torr. An additional chamber purge (or pump/purge) is then performed to rid the reactor of any excess reactants and reaction byproducts. This process is repeated as many times as necessary to get the target chromium oxide film to the desired film thickness.

For the secondary film (example: aluminum oxide), the precursor, trimethylaluminum (at a temperature of about 0° C. to about 30° C.) is delivered to the aerospace component via vapor phase delivery for at pre-determined pulse length of about 0.1 seconds. During this process, the deposition reactor is operated under a flow of nitrogen carrier gas (about 100 sccm total) with the chamber held at a pre-determined temperature of about 150° C. to about 350° C. and pressure about 1 Torr to about 5 Torr. After the pulse of trimethylaluminum, the chamber is then subsequently pumped and purged of all requisite gases and byproducts for a determined amount of time. Subsequently, water vapor is pulsed into the chamber for about 0.1 seconds at chamber pressure of about 3.5 Torr. An additional chamber purge is then performed to rid the reactor of any excess reactants and reaction byproducts. This process is repeated as many times as necessary to get the target aluminum oxide film to the desired film thickness. The aerospace component is then subjected to an annealing furnace at a temperature of about 500° C. under inert nitrogen flow of about 500 sccm for about one hour.

The methods described and discussed herein provide refurbished aerospace components. The methods are utilized to remove corrosion from the aerospace components, and in some examples, remove minimum amounts of protective coatings which contain corrosion, and thereafter, deposit or otherwise form a protective coating on the cleaned aerospace component. The method includes using an aqueous cleaning solution and/or an acidic cleaning solution to remove the corrosion prior to depositing the protective coating. The protective coatings: (1) protect metals from oxidation and corrosion, (2) are capable of relatively high film thickness and composition uniformity on arbitrary geometries, (3) have relatively high adhesion to the metal, (4) are sufficiently thin to not materially increase weight or reduce fatigue life outside of current design practices for bare metal, and/or (5) are deposited at sufficiently low temperature (e.g., 500° C. or less) to not cause microstructural changes to the metal.

Embodiments of the present disclosure further relate to any one or more of the following paragraphs 1-55:

1. A method of refurbishing an aerospace component, comprising: exposing the aerospace component containing corrosion to an aqueous cleaning solution, wherein the aerospace component comprises a nickel superalloy, an aluminide layer disposed on the nickel superalloy, and an aluminum oxide layer disposed on the aluminide layer, and wherein the corrosion is contained on a first portion of the aluminum oxide layer while a second portion of the aluminum oxide layer is free of the corrosion; removing the corrosion from the first portion of the aluminum oxide layer with the aqueous cleaning solution to reveal the first portion of the aluminum oxide layer; then exposing the first and second portions of the aluminum oxide layer to a post-rinse; and forming a protective coating on the first and second portions of the aluminum oxide layer.

2. The method according to paragraph 1, wherein the aqueous cleaning solution comprises water, a complexing agent, and a base.

3. The method according to paragraph 1 or 2, wherein the complexing agent comprises ethylenediaminetetraacetic acid (EDTA) and/or a salt thereof, and wherein the base comprises a hydroxide.

4. The method according to any one of paragraphs 1-3, further comprising: exposing the aerospace component to the aqueous cleaning solution for about 1 hour to about 5 hours; sonicating the aerospace component in the aqueous cleaning solution; and maintaining the aqueous cleaning solution at a temperature of about 20° C. to about 50° C.

5. The method according to any one of paragraphs 1-4, wherein prior to exposing the aerospace component to the aqueous cleaning solution, the method further comprises: exposing the aerospace component to a pre-rinse for about 5 minutes to about 60 minutes; sonicating the aerospace component in the pre-rinse; and maintaining the pre-rinse at a temperature of about 20° C. to about 50° C.

6. The method according to any one of paragraphs 1-5, wherein the pre-rinse comprises an organic solvent and water.

7. The method according to any one of paragraphs 1-6, further comprising: exposing the first and second portions of the aluminum oxide layer to the post-rinse for about 5 minutes to about 60 minutes; sonicating the aerospace component in the post-rinse; and maintaining the post-rinse at a temperature of about 20° C. to about 50° C.

8. The method according to any one of paragraphs 1-7, wherein the post-rinse comprises an organic solvent and water.

9. The method according to any one of paragraphs 1-8, wherein the aluminide layer comprises nickel aluminide, titanium aluminide, magnesium aluminide, iron aluminide, or combinations thereof.

10. The method according to any one of paragraphs 1-9, wherein the aluminide layer has a thickness of about 20 μm to about 500 μm.

11. The method according to any one of paragraphs 1-10, wherein the aluminum oxide has a thickness of about 1 μm to about 50 μm.

12. The method according to any one of paragraphs 1-11, wherein the aerospace component has a thickness of about 1 mm to about 5 mm.

13. The method according to any one of paragraphs 1-12, wherein the protective coating comprises chromium oxide, aluminum oxide, aluminum nitride, hafnium oxide, titanium oxide, titanium nitride, tantalum oxide, tantalum nitride, dopants thereof, or any combination thereof.

14. The method according to any one of paragraphs 1-13, wherein the protective coating has a thickness of about 1 nm to about 10,000 nm.

15. A method of refurbishing an aerospace component, comprising: exposing the aerospace component containing corrosion to an acidic cleaning solution, wherein the aerospace component comprises a nickel superalloy, an aluminide layer disposed on the nickel superalloy, and an aluminum oxide layer disposed on the aluminide layer, and wherein the corrosion is contained on and within the aluminum oxide layer; removing the corrosion and the aluminum oxide layer with the acidic cleaning solution to reveal the aluminide layer; then exposing the aluminide layer to a post-rinse; and forming a protective coating on the aluminide layer.

16. The method according to paragraph 15, wherein the acidic cleaning solution comprises water and about 10 volume percent (vol %) to about 40 vol % of sulfuric acid.

17. The method according to paragraph 15 or 16, further comprising: exposing the aerospace component to the acidic cleaning solution for about 30 minutes to about 90 minutes; stirring the acidic cleaning solution while exposing the aerospace component; and maintaining the acidic cleaning solution at a temperature of about 50° C. to about 150° C.

18. The method according to any one of paragraphs 15-17, wherein prior to exposing the aerospace component to the acidic cleaning solution, the method further comprises: exposing the aerospace component to a pre-rinse for about 5 minutes to about 60 minutes; sonicating the aerospace component in the pre-rinse; and maintaining the pre-rinse at a temperature of about 20° C. to about 50° C.

19. The method according to any one of paragraphs 15-18, wherein the pre-rinse comprises an organic solvent and water.

20. The method according to any one of paragraphs 15-19, wherein prior to exposing the aerospace component to the acidic cleaning solution, the method further comprises: exposing the aerospace component to an aqueous cleaning solution for about 1 hour to about 5 hours; sonicating the aerospace component in the aqueous cleaning solution; and maintaining the aqueous cleaning solution at a temperature of about 20° C. to about 50° C.

21. The method according to any one of paragraphs 15-20, wherein the aqueous cleaning solution comprises water, a complexing agent, and a base.

22. The method according to any one of paragraphs 15-21, wherein the complexing agent comprises EDTA and/or a salt thereof, and wherein the base comprises a hydroxide.

23. The method according to any one of paragraphs 15-22, wherein subsequent to exposing the aerospace component to the acidic cleaning solution, the method further comprises: exposing the aluminide layer to an aqueous cleaning solution for about 1 hour to about 5 hours; sonicating the aerospace component in the aqueous cleaning solution; and maintaining the aqueous cleaning solution at a temperature of about 20° C. to about 50° C.

24. The method according to any one of paragraphs 15-23, wherein the aqueous cleaning solution comprises water, a complexing agent, and a base.

25. The method according to any one of paragraphs 15-24, wherein the complexing agent comprises EDTA and/or a salt thereof, and wherein the base comprises a hydroxide.

26. The method according to any one of paragraphs 15-25, further comprising: exposing the aluminide layer to the post-rinse for about 10 minutes to about 90 minutes; sonicating the aerospace component in the post-rinse; and maintaining the post-rinse at a temperature of about 20° C. to about 50° C.

27. The method according to any one of paragraphs 15-26, wherein the post-rinse comprises an organic solvent and water.

28. The method according to any one of paragraphs 15-27, wherein the aluminide layer comprises nickel aluminide, titanium aluminide, magnesium aluminide, iron aluminide, or combinations thereof.

29. The method according to any one of paragraphs 15-28, wherein the aluminide layer has a thickness of about 20 μm to about 500 μm.

30. The method according to any one of paragraphs 15-29, wherein the aluminum oxide has a thickness of about 1 μm to about 50 μm.

31. The method according to any one of paragraphs 15-30, wherein the aerospace component has a thickness of about 1 mm to about 5 mm.

32. The method according to any one of paragraphs 15-31, wherein the protective coating comprises chromium oxide, aluminum oxide, aluminum nitride, hafnium oxide, titanium oxide, titanium nitride, tantalum oxide, tantalum nitride, dopants thereof, or any combination thereof.

33. The method according to any one of paragraphs 15-32, wherein the protective coating has a thickness of about 1 nm to about 10,000 nm.

34. A method of refurbishing an aerospace component, comprising: exposing the aerospace component containing corrosion to an acidic cleaning solution, wherein the aerospace component comprises a nickel superalloy, an aluminide layer disposed on the nickel superalloy, and an aluminum oxide layer disposed on the aluminide layer, and wherein the corrosion is contained on the aluminum oxide layer and within the aluminum oxide layer and a first portion of the aluminide layer; removing the corrosion, the aluminum oxide layer, and the first portion of the aluminide layer with the acidic cleaning solution to reveal a second portion of the aluminide layer; then exposing the aerospace component to a post-rinse; and forming a protective coating on the second portion of the aluminide layer.

35. The method according to paragraph 34, wherein the acidic cleaning solution comprises water, hydrogen fluoride, and nitric acid.

36. The method according to paragraph 34 or 35, wherein the acidic cleaning solution comprises about 0.2 volume percent (vol %) to about 5 vol % of hydrogen fluoride and about 1 vol % to about 10 vol % of nitric acid.

37. The method according to any one of paragraphs 34-36, further comprising: exposing the aerospace component to the acidic cleaning solution for about 30 minutes to about 90 minutes; stirring the acidic cleaning solution while exposing the aerospace component; and maintaining the acidic cleaning solution at a temperature of about 20° C. to about 50° C.

38. The method according to any one of paragraphs 34-37, wherein prior to exposing the aerospace component to the acidic cleaning solution, the method further comprises: exposing the aerospace component to a pre-rinse for about 5 minutes to about 60 minutes; sonicating the aerospace component in the pre-rinse; and maintaining the pre-rinse at a temperature of about 20° C. to about 50° C.

39. The method according to any one of paragraphs 34-38, wherein the pre-rinse comprises an organic solvent and water.

40. The method according to any one of paragraphs 34-39, wherein prior to exposing the aerospace component to the acidic cleaning solution, the method further comprises: exposing the aerospace component to an aqueous cleaning solution for about 1 hour to about 5 hours; sonicating the aerospace component in the aqueous cleaning solution; and maintaining the aqueous cleaning solution at a temperature of about 20° C. to about 50° C.

41. The method according to any one of paragraphs 34-40, wherein the aqueous cleaning solution comprises water, a complexing agent, and a base.

42. The method according to any one of paragraphs 34-41, wherein the complexing agent comprises EDTA and/or a salt thereof, and wherein the base comprises a hydroxide.

43. The method according to any one of paragraphs 34-42, wherein subsequent to exposing the aerospace component to the acidic cleaning solution, the method further comprises: exposing the aluminide layer to an aqueous cleaning solution for about 1 hour to about 5 hours; sonicating the aerospace component in the aqueous cleaning solution; and maintaining the aqueous cleaning solution at a temperature of about 20° C. to about 50° C.

44. The method according to any one of paragraphs 34-43, wherein the aqueous cleaning solution comprises water, a complexing agent, and a base.

45. The method according to any one of paragraphs 34-44, wherein the complexing agent comprises EDTA and/or a salt thereof, and wherein the base comprises a hydroxide.

46. The method according to any one of paragraphs 34-45, further comprising: exposing the aluminide layer to the post-rinse for about 10 minutes to about 90 minutes; sonicating the aerospace component in the post-rinse; and maintaining the post-rinse at a temperature of about 20° C. to about 50° C.

47. The method according to any one of paragraphs 34-46, wherein the post-rinse comprises an organic solvent and water.

48. The method according to any one of paragraphs 34-47, wherein the aluminide layer comprises nickel aluminide, titanium aluminide, magnesium aluminide, iron aluminide, or combinations thereof.

49. The method according to any one of paragraphs 34-48, wherein the aluminide layer has a thickness of about 20 μm to about 500 μm.

50. The method according to any one of paragraphs 34-49, wherein the aluminum oxide has a thickness of about 1 μm to about 50 μm.

51. The method according to any one of paragraphs 34-50, wherein the aerospace component has a thickness of about 1 mm to about 5 mm.

52. The method according to any one of paragraphs 34-51, wherein the protective coating comprises chromium oxide, aluminum oxide, aluminum nitride, hafnium oxide, titanium oxide, titanium nitride, tantalum oxide, tantalum nitride, dopants thereof, or any combination thereof.

53. The method according to any one of paragraphs 34-52, wherein the protective coating has a thickness of about 1 nm to about 10,000 nm.

54. A refurbished aerospace component produced or formed by any one of the methods according to any one of paragraphs 1-53.

55. The refurbished aerospace component according to paragraph 54, wherein the aerospace component comprises a turbine blade, a turbine blade root, a turbine disk, a turbine vane, a support member, a frame, a rib, a fin, a pin fin, a fuel nozzle, a fuel line, a fuel valve, a combustor liner, a combustor shield, a heat exchanger, or an internal cooling channel.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method of refurbishing an aerospace component, comprising:
exposing an aerospace component containing corrosion to an aqueous cleaning solution, wherein the aerospace component comprises a nickel superalloy, an aluminide layer disposed on the nickel superalloy, and an aluminum oxide layer disposed on the aluminide layer, and wherein the corrosion is contained on a first portion of the aluminum oxide layer while a second portion of the aluminum oxide layer is free of the corrosion;
removing the corrosion from the first portion of the aluminum oxide layer with the aqueous cleaning solution to reveal the first portion of the aluminum oxide layer; then
exposing the first and second portions of the aluminum oxide layer to a post-rinse; and
forming a protective coating on the first and second portions of the aluminum oxide layer.

2. The method of claim 1, wherein the aqueous cleaning solution comprises water, a complexing agent, and a base.

3. The method of claim 2, wherein the complexing agent comprises ethylenediaminetetraacetic acid (EDTA) and/or a salt thereof, and wherein the base comprises a hydroxide.

4. The method of claim 2, further comprising:
exposing the aerospace component to the aqueous cleaning solution for about 1 hour to about 5 hours;
sonicating the aerospace component in the aqueous cleaning solution; and
maintaining the aqueous cleaning solution at a temperature of about 20° C. to about 50° C.

5. The method of claim 1, wherein prior to exposing the aerospace component to the aqueous cleaning solution, the method further comprises:
exposing the aerospace component to a pre-rinse comprising an organic solvent and water for about 5 minutes to about 60 minutes;
sonicating the aerospace component in the pre-rinse; and
maintaining the pre-rinse at a temperature of about 20° C. to about 50° C.

6. The method of claim 1, further comprising:
exposing the first and second portions of the aluminum oxide layer to the post-rinse for about 5 minutes to about 60 minutes;
sonicating the aerospace component in the post-rinse; and
maintaining the post-rinse at a temperature of about 20° C. to about 50° C.

7. The method of claim 1, wherein the aluminide layer comprises nickel aluminide, titanium aluminide, magnesium aluminide, iron aluminide, or combinations thereof.

8. The method of claim 1, wherein the aluminide layer has a thickness of about 20 μm to about 500 μm, wherein the aluminum oxide has a thickness of about 1 μm to about 50 μm, and wherein the aerospace component has a thickness of about 1 mm to about 5 mm.

9. The method of claim 1, wherein the protective coating is deposited by a vapor deposition process, wherein the protective coating comprises chromium oxide, aluminum oxide, aluminum nitride, hafnium oxide, titanium oxide, titanium nitride, tantalum oxide, tantalum nitride, dopants thereof, or any combination thereof, and wherein the protective coating has a thickness of about 1 nm to about 10,000 nm.

10. A method of refurbishing an aerospace component, comprising:
exposing an aerospace component containing corrosion to an acidic cleaning solution, wherein the aerospace component comprises a nickel superalloy, an aluminide layer disposed on the nickel superalloy, and an aluminum oxide layer disposed on the aluminide layer, and wherein the corrosion is contained on and within the aluminum oxide layer;
removing the corrosion and the aluminum oxide layer with the acidic cleaning solution to reveal the aluminide layer; then
exposing the aluminide layer to a post-rinse; and
forming a protective coating on the aluminide layer.

11. The method of claim 10, wherein the acidic cleaning solution comprises water and about 10 volume percent (vol %) to about 40 vol % of sulfuric acid.

12. The method of claim 11, further comprising:
exposing the aerospace component to the acidic cleaning solution for about 30 minutes to about 90 minutes;
stirring the acidic cleaning solution while exposing the aerospace component; and
maintaining the acidic cleaning solution at a temperature of about 50° C. to about 150° C.

13. The method of claim 10, wherein prior to exposing the aerospace component to the acidic cleaning solution, the method further comprises:
exposing the aerospace component to a pre-rinse for about 5 minutes to about 60 minutes;
sonicating the aerospace component in the pre-rinse; and
maintaining the pre-rinse at a temperature of about 20° C. to about 50° C.

14. The method of claim 10, wherein prior to exposing the aerospace component to the acidic cleaning solution, the method further comprises:
exposing the aerospace component to an aqueous cleaning solution for about 1 hour to about 5 hours;
sonicating the aerospace component in the aqueous cleaning solution; and
maintaining the aqueous cleaning solution at a temperature of about 20° C. to about 50° C.

15. The method of claim 14, wherein the aqueous cleaning solution comprises water, a complexing agent, and a base, wherein the complexing agent comprises ethylenediaminetetraacetic acid (EDTA) and/or a salt thereof, and wherein the base comprises a hydroxide.

16. The method of claim 10, wherein subsequent to exposing the aerospace component to the acidic cleaning solution, the method further comprises:
exposing the aluminide layer to an aqueous cleaning solution for about 1 hour to about 5 hours;
sonicating the aerospace component in the aqueous cleaning solution; and
maintaining the aqueous cleaning solution at a temperature of about 20° C. to about 50° C.

17. The method of claim 10, further comprising:
exposing the aluminide layer to the post-rinse for about 10 minutes to about 90 minutes;
sonicating the aerospace component in the post-rinse; and
maintaining the post-rinse at a temperature of about 20° C. to about 50° C.

18. The method of claim 10, wherein the aluminide layer comprises nickel aluminide, titanium aluminide, magnesium aluminide, iron aluminide, or combinations thereof, and wherein the aluminide layer has a thickness of about 20 μm to about 500 μm, and wherein the aluminum oxide has a thickness of about 1 μm to about 50 μm.

19. The method of claim 10, wherein the protective coating is deposited by a vapor deposition process, wherein the protective coating comprises chromium oxide, aluminum oxide, aluminum nitride, hafnium oxide, titanium oxide, titanium nitride, tantalum oxide, tantalum nitride, dopants thereof, or any combination thereof, and wherein the protective coating has a thickness of about 1 nm to about 10,000 nm.

20. A method of refurbishing an aerospace component, comprising:
exposing an aerospace component containing corrosion to an acidic cleaning solution, wherein the aerospace component comprises a nickel superalloy, an aluminide layer disposed on the nickel superalloy, and an aluminum oxide layer disposed on the aluminide layer, and wherein the corrosion is contained on the aluminum oxide layer and within the aluminum oxide layer and a first portion of the aluminide layer;
removing the corrosion, the aluminum oxide layer, and the first portion of the aluminide layer with the acidic cleaning solution to reveal a second portion of the aluminide layer; then
exposing the aerospace component to a post-rinse; and
forming a protective coating by a vapor deposition process on the second portion of the aluminide layer, wherein the vapor deposition process is a thermal atomic layer deposition (ALD) process, a plasma-enhanced ALD (PE-ALD) process, a thermal chemical vapor deposition (CVD) process, a plasma-enhanced CVD (PE-CVD) process, or a pulsed-CVD process.

* * * * *